(12) United States Patent
Hutton et al.

(10) Patent No.: US 7,902,864 B1
(45) Date of Patent: Mar. 8, 2011

(54) HETEROGENEOUS LABS

(75) Inventors: Michael D. Hutton, Mountain View, CA (US); Keith Duwel, San Francisco, CA (US); Gregg William Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/292,856

(22) Filed: Dec. 1, 2005

(51) Int. Cl.
 *H03K 19/177* (2006.01)
(52) U.S. Cl. ............... 326/39; 326/38; 326/41; 326/47
(58) Field of Classification Search .............. 326/37–41, 326/47
See application file for complete search history.

(56) References Cited

U.S. PATENT DOCUMENTS

| | | | |
|---|---|---|---|
| 5,689,195 A | 11/1997 | Cliff et al. | |
| 5,815,726 A * | 9/1998 | Cliff .................................. | 712/1 |
| 5,850,152 A | 12/1998 | Cliff et al. | |
| 5,977,793 A | 11/1999 | Reddy et al. | |
| 6,144,573 A | 11/2000 | Heile | |
| 6,150,838 A * | 11/2000 | Wittig et al. ..................... | 326/39 |
| 6,154,053 A * | 11/2000 | New ................................. | 326/41 |
| 6,157,209 A * | 12/2000 | McGettigan .................... | 326/39 |
| 6,160,419 A | 12/2000 | Veenstra et al. | |
| 6,215,326 B1 | 4/2001 | Jefferson et al. | |
| 6,344,989 B1 | 2/2002 | Heile | |
| 6,396,302 B2 * | 5/2002 | New et al. ....................... | 326/38 |
| 6,407,576 B1 | 6/2002 | Ngai | |
| 6,453,382 B1 | 9/2002 | Heile | |
| 6,476,634 B1 * | 11/2002 | Bilski ............................. | 326/40 |
| 6,507,942 B1 * | 1/2003 | Calderone et al. .............. | 716/16 |
| 6,636,070 B1 * | 10/2003 | Altaf .............................. | 326/38 |
| 6,798,240 B1 | 9/2004 | Pedersen | |
| 6,888,373 B2 * | 5/2005 | Kaptanoglu et al. ........... | 326/40 |
| 6,943,580 B2 | 9/2005 | Lewis et al. | |
| 7,167,022 B1 * | 1/2007 | Schleicher et al. ............. | 326/41 |
| 7,196,541 B2 * | 3/2007 | Nowak-Leijten ............... | 326/38 |
| 7,295,035 B1 * | 11/2007 | Agrawal et al. ................ | 326/38 |
| 7,397,276 B1 * | 7/2008 | Agrawal et al. ................ | 326/41 |
| 7,558,812 B1 * | 7/2009 | Padalia et al. ................. | 708/235 |
| 2004/0155676 A1 * | 8/2004 | Kaptanoglu et al. ........... | 326/38 |

(Continued)

OTHER PUBLICATIONS

Kaviani, "Novel Architectures and Synthesis Methods for High Capacity Field Programmable Devices", Department of Electrical and Computer Engineering, University of Toronto, CA, Jan. 1999.

(Continued)

*Primary Examiner* — James H. Cho
*Assistant Examiner* — Jason M Crawford
(74) *Attorney, Agent, or Firm* — Weaver Austin Villeneuve & Sampson LLP

(57) ABSTRACT

Disclosed is a programmable logic device ("PLD") including at least one lookup table ("LUT") based logic element ("LE") of a first type and at least one LUT based LE of a second type. The first type of LE is different from the second type of LE. The term 'different' when used herein to describe the relationship of a first logic structure and/or its components to a second logic structure and/or its components indicates a difference in hardware design as opposed to a configuration difference or non-designed differences resulting, for example, from manufacturing variability. Additionally, a PLD can include at least one logic array block ("LAB") of a first type having at least one LUT based LE and at least one LAB of a second type having at least one LUT based LE. The first type of LAB being different from the second type of LAB.

45 Claims, 15 Drawing Sheets

U.S. PATENT DOCUMENTS

2004/0155677 A1* 8/2004 Lewis et al. .................. 326/40
2004/0178818 A1* 9/2004 Crotty et al. .................. 326/40
2006/0279330 A1* 12/2006 Phoon et al. .................. 326/47
2007/0063732 A1* 3/2007 Kaptanoglu et al. ........... 326/40

OTHER PUBLICATIONS

Kaviani et al., "A Novel FPGA Architecture Combining LookUp Tables and PLA-like Blocks", Department of Electrical and Computer Engineering, University of Toronto, CA.

Heile et al., "Programmable Memory Blocks Supporting Content-Addressable Memory", Altera, ACM Publishing, 2000.

Hutton, et al., "Timing-Driven Placement for Hierarchical Programmable Logic Devices" Altera, ACM Publishing 2001.

Hutton et al., "Interconnect Enhancements for a High-Speed PLD Architecture", Altera, ACM Publishing 2002, Feb. 24-26, 2002.

Kaviani et al., "Hybrid FPGA Architecture", Altera, ACM Publishing 1996.

Kaviani, "Novel Architectures and Synthesis Methods for High Capacity Field Programmable Devices", Department of Electrical and Computer Engineering, University of Toronto, 1999.

U.S. Appl. No. 10/718,968, filed Nov. 21, 2003.

* cited by examiner

Direct Drive Switch

Mux-Demux Switch

HETEROGENEOUS LABS

BACKGROUND OF THE INVENTION

1. Field of the Invention

The present invention relates to logic elements for use with programmable logic devices or other similar devices.

2. Description of the Related Art

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements (LEs) sometimes referred to as logic array blocks ("LABs"; also referred to by other names, e.g., "configurable logic blocks," or "CLBs"). As used herein, the term logic elements ("LEs", also referred to by other names, e.g., "logic cells") indicates a logic circuit that includes at least one look-up table (LUT). An LE may also include a carry-out chain, register, and other elements.

Logic elements typically include configurable elements holding configuration data that determines the particular function or functions carried out by the logic element. A typical LUT circuit may include ram bits that hold data (a "1" or "0"). However, other types of configurable elements may be used. Some examples may include static or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "memory element" will be used to refer to any programmable element that may be configured to determine functions implemented by other PLDs.

A typical LUT circuit used as a logic element provides an output signal that is a function of multiple input signals. The particular logic function may be determined by programming the LUT's memory elements. A typical LUT circuit may be represented as a plurality of memory elements coupled to a "tree" of 2:1 MUXes. The LUT MUX tree includes a first level comprising a single 2:1 MUX providing the LUT output and also includes successive additional levels of MUXes, each level including twice as many MUXes as the previous level and the number of memory elements being twice as many as the number of 2:1 MUXes in a last MUX level coupled to the memory elements. Each 2:1 MUX level provides a logic input to the LUT circuit coupled to control inputs of the MUXes at that MUX level. Thus, to obtain an n-input LUT (or "nLUT") typically requires 2n memory elements and 2n MUXes. Adding an input to an nLUT circuit to provide an n+1 input LUT ("(n+1)LUT") therefore typically requires providing a total of 2n+1 memory elements and (2n+1-1) MUXes, i.e., approximately a doubling of resources relative to that required by an nLUT.

The expressive power of an LE is a quantification of the amount of generic logic that the LE can support. For example, if a given hardware circuit can be implemented using either 20 LEs of type A or 10 LEs of type B, type B has greater expressive power than type A.

Greater expressive power normally comes at a cost in that an LE of type B will typically consume greater silicon area than an LE of type A. Additionally, depending on the logic to be implemented, the expressive power of an LE of type B may not be necessary. Thus, if a LAB is made up of LEs of type B, and the logic to be implemented by the LAB does not require the expressive power of an LE of type B, but could be as efficiently implemented in an LE of type A having less expressive power, inefficiencies may result.

One way to address this problem is discussed in A. Kaviani, Novel Architectures and Synthesis methods for High Capacity Field Programmable Devices, Doctoral Thesis, University of Toronto, January, 1999. Kaviani discloses a PLD architecture combining both FPGAs based on LUTs and Complex Programmable Logic Devices (CPLDs) based on product terms and not using LUTs. CPLDs however, generally have a lower logic capacity, measured in terms of equivalent logic gates, than LUT based FPGAs. Thus, the PLD architecture of Kaviani may not provide adequate power for efficient implementation of a number of logic configurations.

BRIEF SUMMARY OF THE INVENTION

In accordance with the present invention, a programmable logic device ("PLD") includes at least one lookup table ("LUT") based logic element ("LE") of a first type and at least one LUT based LE of a second type. The first type of LE is different from the second type of LE. The term 'different' when used herein to describe the relationship of a first logic structure and/or its components to a second logic structure and/or its components indicates a difference in hardware design as opposed to a configuration difference or non-designed differences resulting, for example, from manufacturing variability.

Additionally, in accordance with the present invention, a PLD can include at least one logic array block ("LAB") of a first type having at least one LUT based LE and at least one LAB of a second type having at least one LUT based LE, the first type of LAB being different from the second type of LAB.

The construction of logic elements or groups/LABs of logic elements often requires certain common or homogeneous design styles. For example, use of the same Vdd or voltage supply, design rules such as width or spacing of interconnect wires, common layout "building block" or building block sizes, and common X or Y pitch (physical dimension) for efficiency. Further, certain features are binary—such as the existence of a flip-flop connected to the LUT or the lack of a flip-flop, or the general existence/lack of a feature even though the overall goals of the architecture might not require a 1:1 correspondence between the two quantities overall or require the use of such a feature in every LE or LAB. The use of heterogeneous block types at the LE or LAB level thus allows for relatively better adjustment of the balance of delay, area, features, routability, flexibility, power consumption, and the like for the overall device without requiring individual blocks to have identical construction.

DETAILED DESCRIPTION OF THE INVENTION

Figure 1:
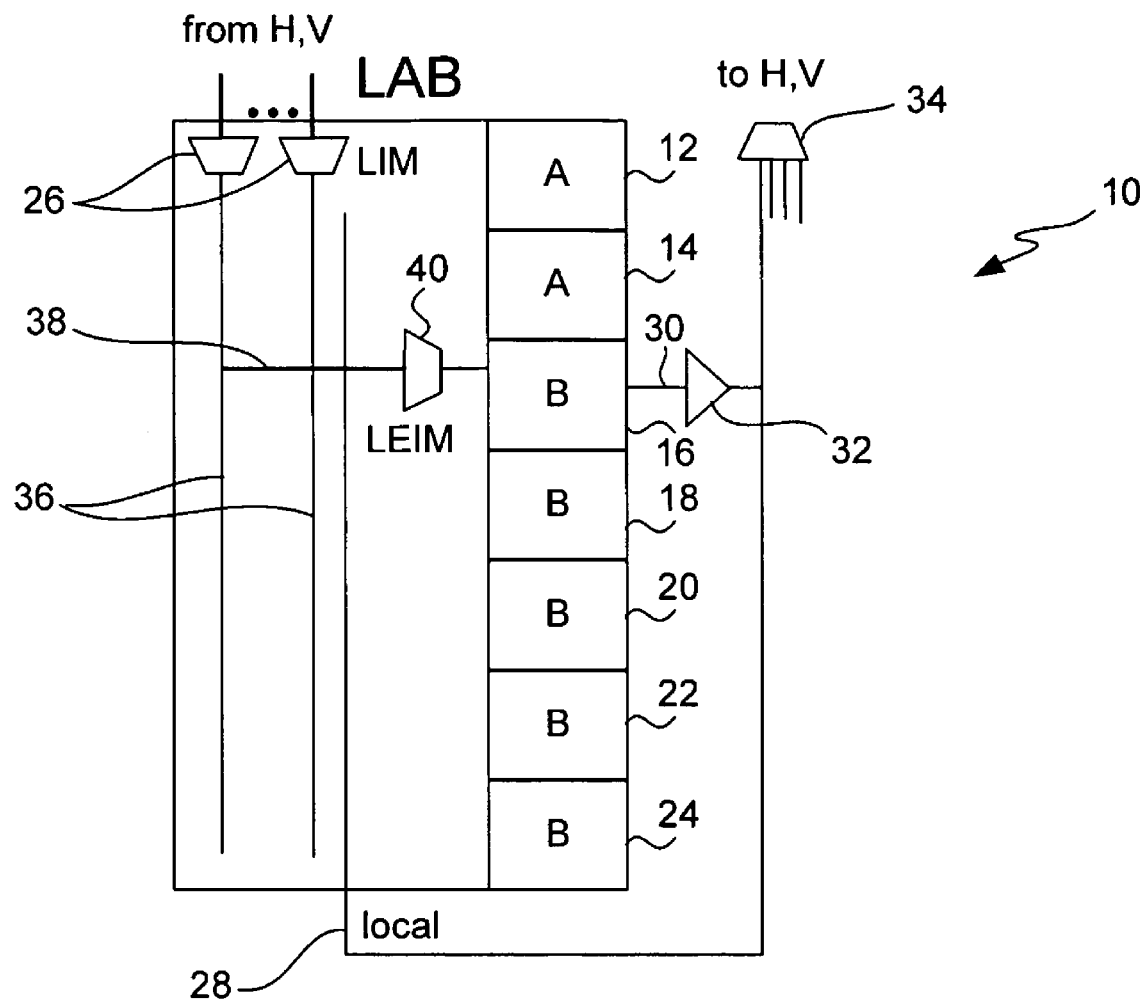
FIG. 1 is diagrams illustrating a logic array block (LAB) having different types of logic elements (LEs) accordance with the present invention.

FIG. 1 is a block diagram illustrating a logic array block (LAB) in accordance with the present invention. LAB 10 includes logic elements (LEs) 12, 14, 16, 18, 20, 22 and 24, which will be discussed in greater detail below. A typical PLD would include a number or LABs such as LAB 10. As would be understood by one of ordinary skill in the art, global horizontal and global vertical lines (not shown) can interconnect LABs in the PLD. Logic input MUXes (LIMs) 26 select from global horizontal and vertical lines to feed LIM lines 36. Although only two LIMs 116 are illustrated in FIG. 1, a LAB in accordance with the present invention may includes greater or fewer LIMs to feed any number of LIM lines 36. LIM lines 36 drive logic element input MUXes (LEIMs) 40 through LEIM lines 38. LEIMs 40 drive inputs to LEs 12 to 24. LAB 10 can include any number of LEIM lines and LEIMs and LEs 12 to 24 can each include any number of inputs, and preferably include from 3 to 6 inputs each. LAB 10 also includes local lines 28 which are driven by outputs 30 of LEs 12-24 through buffers 32. Each LE can include any number of outputs and preferably includes from 1 to 4 outputs. Local lines 28 drive output MUXes 34 which drive global horizontal and global vertical lines. Local lines can also drive LEIMs 40 to allow the output of an LE to drive the input of another or the same LE. As is understood in the art, and discussed below, LEs of LAB 10 may also include other interconnections to each other and secondary signals such as, without limitation, synchronous clear, clock enable, synchronous load, asynchronous load and asynchronous clear signals (none shown in FIG. 1). The architecture of LAB 10 is only exemplary and it is considered that other LAB architectures may be used in implementation of the present invention. For example, without limitation, a LAB may include greater or fewer than 7 LEs, local lines may or may not be included, and/or additional logic may be included to perform additional functions such as allowing local lines to be shared among adjacent LABs.

In the example of FIG. 1, LEs 12 through 24 are of two different types. The term 'different' when used herein to describe the relationship of a first logic structure and/or its components to a second logic structure and/or its components indicates a difference in hardware design as opposed to a configuration difference or non-designed differences resulting, for example, from manufacturing variability. In particular, LEs 12-14 are of type A and LEs 16-24 are of type B. Including different types of LEs in a single LAB can advantageously increase the flexibility and efficiency of the LAB for a given configuration.

Figure 2:
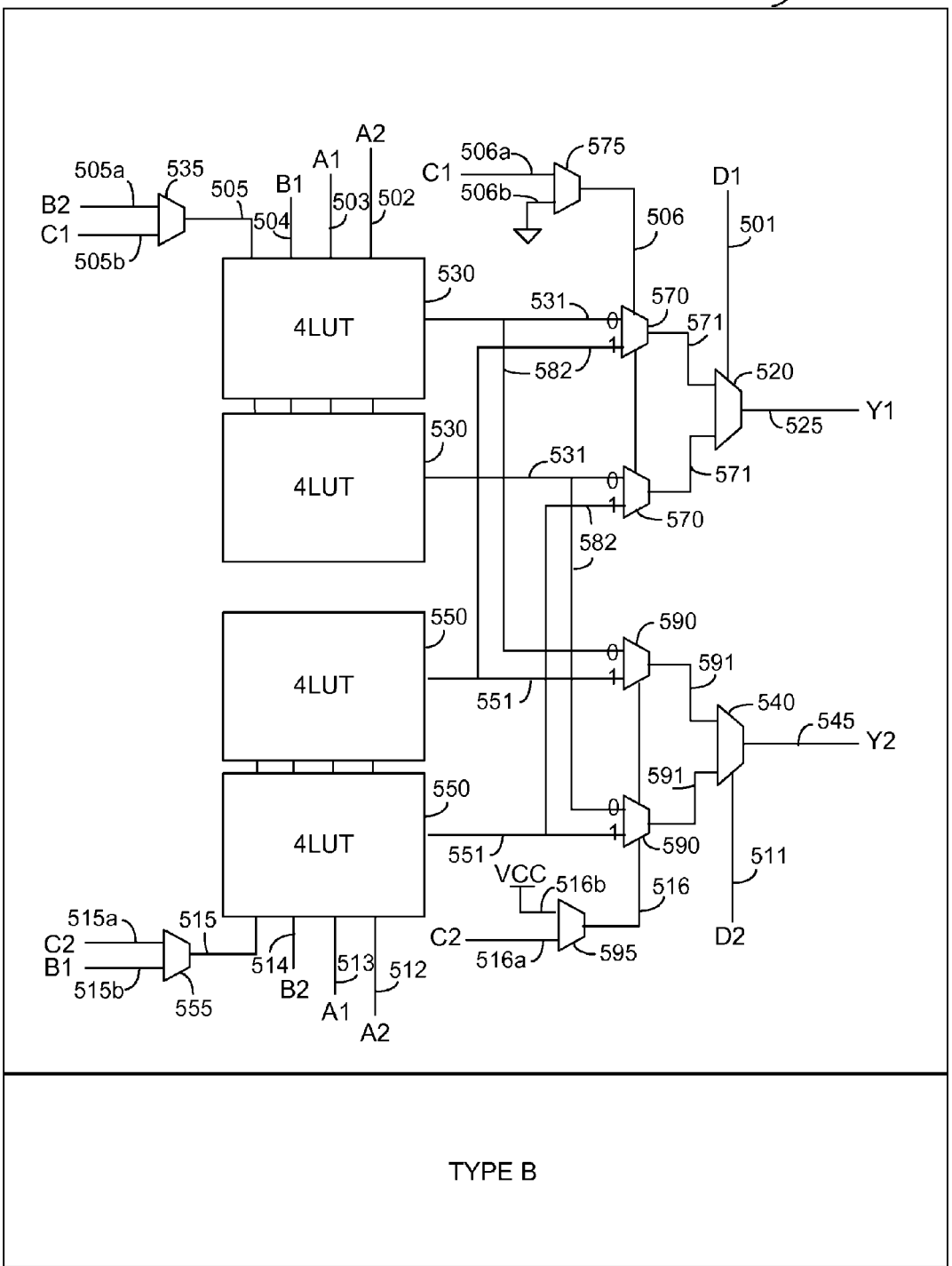
FIG. 2 illustrates one exemplary LE that could be used as one of the types of LEs shown in FIG. 1.

An example of a type A LE is shown in FIG. 2 which illustrates a logic circuit 500. Logic circuit 500 is disclosed in co-owned U.S. Pat. No. 6,798,240 for Logic Circuitry with Shared Lookup Table issued Sep. 28, 2004 which is incorporated by reference in its entirety. As will be described, logic circuitry 500 combines two 5LUT circuits and a plurality of MUXes. Logic circuit 500 provides, depending on configuration, functionality of either two 5LUT circuits which may or may not implement the same function, or two 6LUT circuits which implement the same function. As another alternative, logic circuit 500 may be configured to implement the functionality of two 4LUT circuits. These aspects will now be described in further detail.

First 5LUT circuitry includes 4LUTs 530 lines 531 and 571 and MUX 520. Note that FIG. 2 just shows 4LUTs 530 as single "4LUT" blocks to avoid overcomplicating the drawing. The control input of MUX 520 is coupled to first input 501. Control inputs of MUXes within each 4LUT 530 (MUXes internal to 4LUTs 530 not separately shown) are coupled to respective second, third, fourth and fifth inputs 502, 503, 504, and 505. The output of MUX 520 is coupled to provide output signal Y1 at output 525.

Second 5LUT circuitry includes 4LUTs 550, lines 551 and 591 and MUX 540. The control input of MUX 540 is coupled to first input 511. Control inputs of MUXes in respective MUX levels within each 4LUT 550 (MUXes internal to 4LUTs 550 not separately shown) are coupled to respective second, third, fourth and fifth inputs 512, 513, 514, and 515. The output of MUX 540 is coupled to provide output signal Y2 at output 545.

Relative to output 525, input 501 may be said to be coupled to a control input of a MUX at a first MUX level of first 5LUT circuitry. Input 502 may be said to be coupled to control inputs of MUXes at a second MUX level of first 5LUT circuitry. Similarly, relative to output 545, input 511 may be said to be coupled to a control input of a MUX at a first MUX level of second 5LUT circuitry. Input 512 may be said to be coupled to control inputs of MUXes at a second MUX level of second 5LUT circuitry.

Additional circuitry includes MUXes 570, MUXes 590, and lines 582. Relative to the MUX levels of first and second 5LUT circuitry, MUXes 570 and 590 are interposed between a first and second MUX level. Outputs of 4LUTs 530 are respectively coupled to respective first inputs (labeled "0") of MUXes 570 via respective lines 531 and to respective first inputs of MUXes 590 via respective lines 582 as shown. Outputs of 4LUTs 550 are respectively coupled to respective second inputs (labeled "1") of MUXes 590 via respective lines 551 and to respective second inputs of MUXes 570 via respective lines 582 as shown. Outputs of MUXes 570 are coupled to inputs of MUX 520 via lines 571 and outputs of MUXes 590 coupled to inputs of MUX 540 via lines 591 as shown. Control inputs of MUXes 570 are coupled to a first additional input 506. Control inputs of MUXes 590 are coupled to a second additional input 516.

Further additional circuitry includes MUXes 535, 555, 575, and 595. The output of MUX 535 is coupled to logic input 505 as shown. MUX 535 also includes inputs 505a and 505b which are coupled to receive, respectively, signals B2 and C1. The output of MUX 555 is coupled to logic input 515 as shown. MUX 555 also includes inputs 515a and 515b which are coupled to receive, respectively, signals C2 and B1.

The output of low tie-off MUX 575 is coupled to logic input 506. MUX 575 also includes inputs 506a and 506b. Input 506a is coupled to receive signal C1. Input 506b is coupled to ground as indicated by the downwardly pointing arrow. The output of high tie-off MUX 595 is coupled to logic input 516. MUX 595 also includes inputs 516a and 516b. Input 516a is coupled to receive signal C2. Input 516b is coupled to Vcc.

Logic circuit 500 may be configured to operate in either a 5LUT mode, a 4LUT, or a 6LUT mode as follows:

(i) 5LUT Mode

To operate logic circuitry 500 in 5LUT mode, MUX 575 is programmed to select input 506b which is coupled to ground; MUX 595 is programmed to select input 516b which is coupled to Vcc; MUX 535 is programmed to select input 505b which receives signal C1; and MUX 555 is programmed to select input 515a which receives signal C2. In this mode, because input 506 is tied to ground and input 516 is tied to Vcc, MUXes 570 all select their first inputs (labeled "0") and MUXes 590 all select their second inputs (labeled "1"). In this mode, signals from lines 531 are passed to lines 571 and signals from lines 551 are passed to lines 591, effectively reducing circuitry 500 to the functionality of two independent 5LUT circuits with two inputs being shared across the two halves of circuit 500 (inputs 503 and 513 both receive signal A1 and inputs 502 and 512 both receive signal A2). In particular, in this mode, signal Y1 is a function of input signals C1, B1, A1, A2, and D1 and signal Y2 is a function of input signals C2, B2, A1, A2 and D2. The programming of memory elements 509 determines the particular function that Y1 is of the input signals C1, B1, A1, A2, and D1; and the programming of memory elements 319 determines the particular function that Y2 is of C2, B2, A1, A2 and D2. Thus, two distinct five-input functions may be provided.

(ii) 4LUT Mode ("(n−1)LUT")

To operate logic circuitry 500 in 4LUT mode, MUXes 575, 595, 535 and 555 are programmed the same as just described above for 5LUT mode. As will be appreciated by those skilled in the art, memory elements in 4LUTs 530 and 4LUTs 550 (memory elements not separately shown) may be programmed to ignore one input for each half of circuitry 500.

For example, memory elements in 4LUTs 530 may be programmed so that input signal A1 at input 503 is effectively ignored (i.e., the value of A1 would not affect the value of output signal Y1). Similarly, memory elements in 4LUTs 550 may be programmed so that input signal A2 at input 512 is also effectively ignored. In such an example, signal Y1 would then be a function of C1, B1, A2, and D1 and Y2 would be a function of C2, B2, A1, and D2. Thus, in this example, the functionality of two independent 4LUT circuits would be provided and no shared inputs would be required. As will be appreciated by those skilled in the art, in an alternative modification in which A2 were ignored at input 502 instead of A1 being ignored at input 503, then one shared input (503 and 513 coupled together) would exist for the two independent 4LUT functions.

(iii) 6LUT Mode

To operate circuitry 500 in the 6LUT mode, MUX 575 is programmed to select input 506a which receives signal C1; MUX 535 is programmed to select input 505a which receives signal B2; MUX 595 is programmed to select input 516a which receives signal C2; and MUX 555 is programmed to select input 515b which receives signal B1. In this mode, four inputs are shared across the two halves of the circuitry 500: inputs 505 and 514 both receive the same signal B2; inputs 504 and 515 both receive the same signal B1; inputs 503 and 513 both receive the same signal A1, and inputs 502 and 512 both receive the same signal A2. Thus, in this mode, circuitry 500 provides the functionality of two 6LUT circuits that may be configured to provide the same functions of six inputs, four of the inputs being shared across the two 6LUT circuits. In particular, in this mode, signal Y1 is a function of input signals B2, B1, A1, A2, C1, and D1 and signal Y2 is a function of input signals B1, B2, A1, A2, C2, and D2. The particular function implemented depends upon the programming of memory elements.

Figure 3:
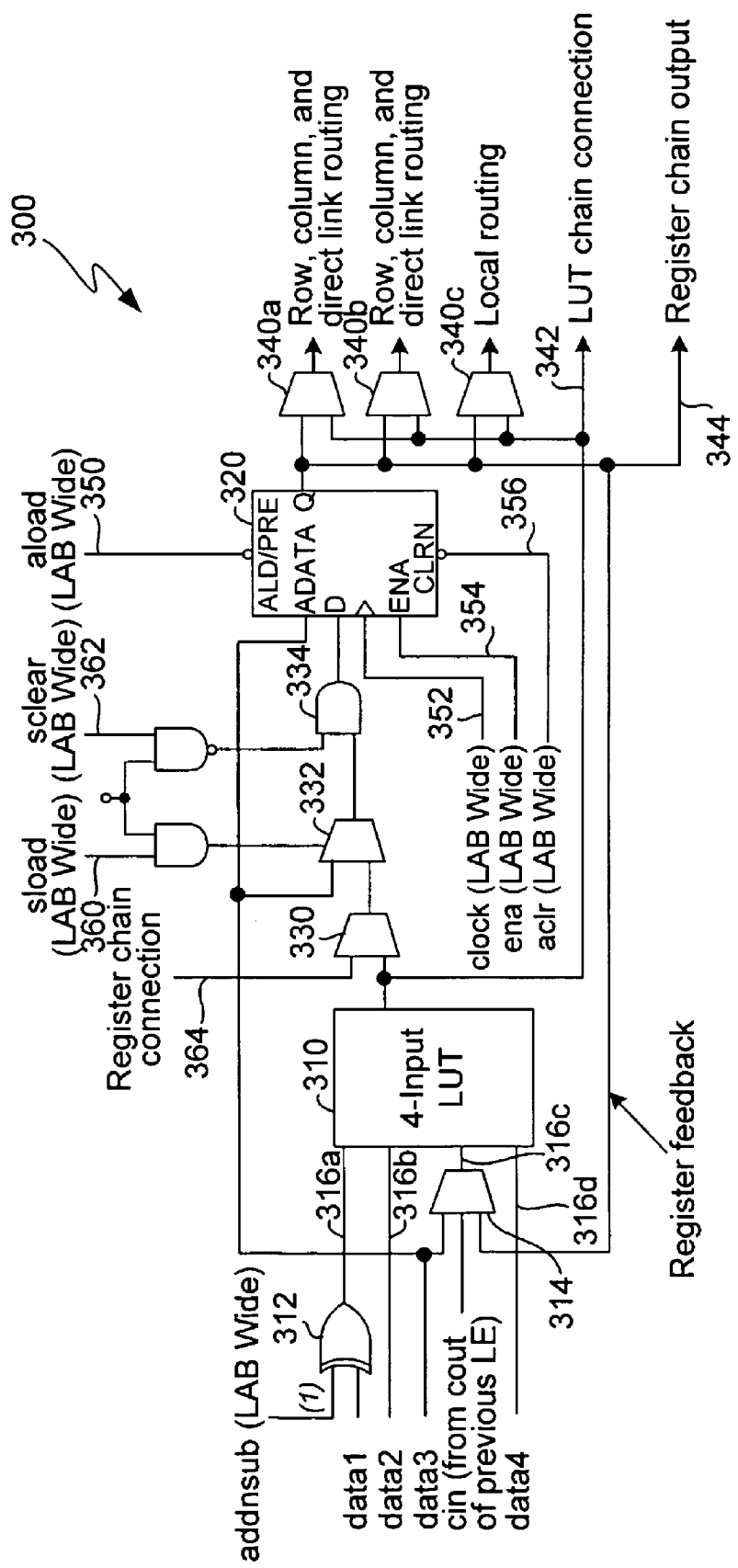
FIG. 3 illustrates another exemplary LE that could be used as one of the types of LEs shown in FIG. 1.

An example of a type B LE is illustrated in FIG. 3 which is a block diagram of an logic circuit having 4 data inputs. In particular, logic circuit 300 includes a single 4-LUT 310 and a single register 320. 4-LUT 310 in driven by 4 inputs 316a-316d. Input 316a is driven by XOR gate 312 which is driven by a LAB-wide add and subtract signal and data input data1. Input 316b is driven by data input data2. Input 316c is driven by 3 MUX 314. Inputs to 3-MUX 314 include data input data 3, a carry in signal cin from a previous LE (not shown) and Q output of register 320. Input 316d is driven by data input data4. 4-LUT 310 drives a first intermediate MUX 320 along with a register chain connection 364 which is routed from a register output from another LE (not shown). 4-LUT 310 also directly drives an LE output to allow complete bypassing of register 320. First intermediate MUX 330 drives second intermediate MUX 332 along with data input data3. A selection input of second intermediate MUX 332 is driven by a LAB wide synchronous load signal 360 that is logically ANDed with a logical high signal. Second intermediate MUX 332 drives AND gate 334 along with a LAB wide synchronous clear signal 362 that is inverse ANDed with a logical high signal. The output of AND gate 334 drives the D input of register 320. Register 320 is also driven by an asynchronous load signal 350, a clock signal 352, an enable signal 354 and an asynchronous clear signal 356 each of which is LAB wide. An ADATA input of register 320 is driven by the data3 input.

Logic circuit 300 includes first output MUX 340a, second output MUX 340b and third output MUX 340c. First, second and third output MUXs 340a, 340b and 340c, respectively, are each driven by 4-LUT 310 and the Q-output of register 320. Both first and second output MUXs 340a and 340b can drive onto global horizontal lines (not shown) and global vertical lines (not shown). Third output 340c can drive onto local lines such as local lines 28 of LAB 100 shown in FIG. 1. The Q-output of register 320 also drives both a LUT chain connection 342 that allows the output of 4-LUT 310 to drive a LUT in another LE and register chain output 344 that can be input into the register of another LE (not shown).

Logic circuit 500 shown in FIG. 2 and logic circuit 300 shown in FIG. 3 are different in a number of ways. For example, logic circuit 500 can carry out logic functions of up to 6 inputs and, as discussed above, is fracturable so that logic circuit 500 can carry out two logic functions having fewer than 6 inputs. Also, logic circuit 500 does not include a register. Logic circuit 300 is not fracturable, can carry out at most a 4 input logic function but does include a register. Thus, the types of logic functions, efficiency, timing, and required silicon area associated with each are different and therefore, one may be desirable over the other depending on the implemented logic. And, as shown in FIG. 1, in accordance with the present invention, both types of logic circuits can be included in the same LAB. Accordingly, a LAB such as LAB 100 may provide relatively more versatility that a LAB including only a single type of LE. That is, a wider variety of logic functions may be programmable in a LAB such as LAB 100 with relatively greater efficiency.

Figure 4:
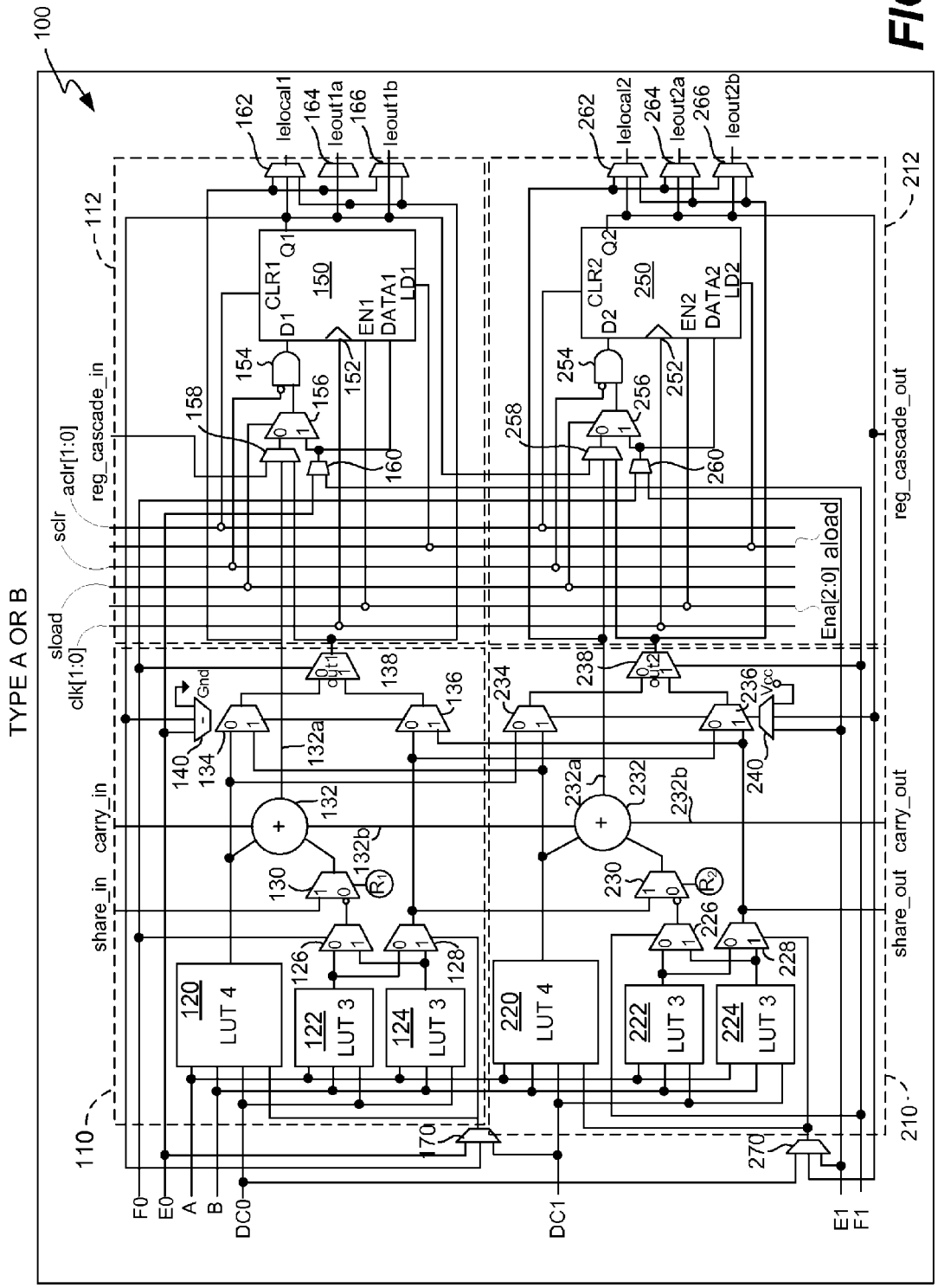
FIG. 4 illustrates yet another exemplary LE that could be used as one of the types of LEs shown in FIG. 1.

Either type A LE or type B LE, or both, may also be different from logic circuit 500 and logic circuit 300, respectively. A third example of a logic circuit that could be used as a type A LE or a type B LE is shown in FIG. 4. FIG. 4 illustrates a logic circuit 100. Logic circuit is disclosed in co-owned, co-pending U.S. patent application Ser. No. 10/810,117 for Omnibus Logic Element, filed Mar. 25, 2004 which is incorporated by reference in its entirety. To clarify description, logic circuit 100 can be divided into four parts: a first arithmetic portion 110 associated with a first register portion 112 and a second arithmetic portion 210 associated with a second register portion 212. First arithmetic portion 110 and second arithmetic portion 110 each include 3 lookup tables (LUTs). First arithmetic portion 110 includes a first 4 input LUT (4LUT) 120, first 3LUT 122 and second 3LUT 124, Second arithmetic portion 210 includes second 4LUT 220, third 3LUT 222 and fourth 3LUT 224. First and second 3-LUT 122 and 124 drive 2, 2 input MUXs (2MUXs) 126 and 128 of first arithmetic portion 110. Similarly, third 3LUT 222 and fourth 3LUT 224 each drive 2 input MUXs (2MUXs) 226 and 228 of second arithmetic portion 210.

In first arithmetic portion 110, 2MUX 126 drives one input of a share 2MUX 130 which, in turn, drives one input of a first adder 132. A second input of share 2MUX 130 is driven by a share-in input which is driven by an adjacent LE (not shown). In second arithmetic portion 210, 2MUX 226 drives one input of a share 2MUX 230 which, in turn, drives one input of a second adder 232. A second input of share 2MUX 230 is driven by the output of 2MUX 128. As discussed in detail below, share 2MUXs 130 and 230 allow a signal driven by an adjacent LUT or LE to be included in a arithmetic function.

First arithmetic portion 110 also includes first fracturing 2-MUX 134 and second fracturing 2-MUX 136. First fracturing 2MUX is driven by first 4LUT 120 and second 4LUT 220 and second fracturing 2MUX is driven by 2MUX 128 and 2MUX 228. Also, first fracturing 3MUX 140 drives the selection inputs of both first and second fracturing 2MUXs 134 and 136. First fracturing 3MUX 140 is driven by input E0, output Q1 of first register 150, discussed below, and a ground input Gnd. Second arithmetic portion 210 includes a third fracturing 2MUX 234 and a fourth fracturing 2MUX 236. Third fracturing 2MUX 234 is driven by first 4LUT 120 and second 4LUT 220 and fourth fracturing 2MUX 236 is driven by 2MUX 128 and 2MUX 228. A second fracturing 3MUX 240 is driven by input E1, a Q2 output of second register 250, discussed below, and a supply voltage signal Vcc. Second fracturing 3MUX 240 drives the selection inputs of both third fracturing 2MUX 234 and fourth fracturing 2MUX 236. As discussed in detail below, fracturing 2MUXs 134, 136, 234 and 236 and fracturing 3MUXs 140 and 240 allow LE 100 to be fractured to provide independent combinational functions which may share inputs.

A first combinational output OUT1 of first arithmetic portion 110 is driven by first combinational output 2MUX 138 and a second combinational output OUT2 of second arithmetic portion 210 is driven by second combinational output 2MUX 238. First combinational output 2MUX 138 is driven by first fracturing 2MUX 134 and second fracturing 2MUX 136. Second combinational output 2MUX 238 is driven by first fracturing 2MUX 234 and second fracturing 2MUX 236.

LE 100 includes 8 signal inputs A, B, DC0, DC1, E0, F0, E1 and F1. Inputs A and B are always shared and drive 4LUTs 120 and 220 and 3LUTS 122, 124, 222 and 224. Input DC0 always drives 4LUT 120 and 3LUTS 122 and 124 of first arithmetic portion. Additionally, input DC0 may be shared with second arithmetic portion 210 through second input 3MUX 270, through which input DC0 may also drive second 4LUT 220 and 2MUX 228. Input DC1 always drives second 4LUT 220 and 3LUTS 222 and 224 of second arithmetic portion 210. Additionally, input DC1 may be shared with first arithmetic portion 110 through first input 3MUX 170, through which input DC1 may also drive first 4LUT 120 and the selection input for 2MUX 128. Input E0 feeds first input 3MUX 170, first fracturing 3MUX 140, discussed above, and first bypass 2MUX 160 of first register portion 112, which will be further discussed below. Input E1 feeds second input 3MUX 270, second fracturing 3MUX 240 and second bypass 2MUX 260 of second register portion 212, which will be further discussed below. Input F0 drives the selection input of 2MUX 126, the selection input of first combinational output 2MUX 138 and second bypass 2MUX 260 of second register portion 212. Input F1 drives the selection input of 2MUX 226, the selection input of second combinational output 2MUX 238 and first bypass 2MUX 160 of first register portion 112.

First combinational output OUT1 of first arithmetic portion 110 drives first register portion 112 and second combinational output OUT2 of second arithmetic portion 210 drives second register portion 212. First register portion 112 includes a first register 150 and second register portion 212 includes a second register 250. As is well understood in the art, registers 150 and 250 include clear inputs CLR1 and CLR2, respectively, each driven by one of two alcr1 and aclr0 signals, asynchronous load inputs LD1 and LD2 respectively, each driven by an aload signal, clock enable inputs EN1 and EN2, respectively, driven by one of three ena2, ena1 and ena0 signals, and a clock input 152 and 252, respectively, each driven by one of clkl and clk0 signals. Clear signals, asynchronous load signals, clock enable signals, and clock signals are all well understood by those skilled in the art.

Input D1 of first register 150 is driven by a first AND gate 154 which is driven by an inverted sclr signal and the output from a first packing 2MUX 156, which, as explained in detail below, allows first register 150 to be driven either by first arithmetic portion 110, an LE input E0 or F1, or a cascaded register outside of LE 100. Packing 2MUX 156 is driven by a first register 3MUX 158, which is driven by a register cascade in input, the output from first adder 132 and first arithmetic portion output OUT1. A second input of first packing 2MUX 156 is driven by first bypass 2MUX 160 which is driven by LE input E0 and LE input F1. First bypass 2MUX 160 also drives a DATA1 input of register 150.

Regarding second register portion 250, input D2 of second register 250 is driven by a second AND gate 254 which is driven by an inverted sclr signal and the output from a second packing 2MUX 156, which, as explained in detail below, allows second register 250 to be driven either by second arithmetic portion 210, an LE input E1 or F0, or output Q1 of first register 150. Packing 2MUX 256 is driven by a second register 3MUX 258, which is driven by first register output Q1, the output from second adder 232 and second arithmetic portion output OUT2. A second input of second packing 2MUX 256 is driven by second bypass 2MUX 260 which is driven by LE input E1 and LE input F0. Second bypass 2MUX 260 also drives a DATA2 input of second register 250.

First register portion 112 includes 3 outputs; lelocal1, driven by first output 3MUX 162; leout1a, driven by second output 3MUX 164; and leout1b, driven by third output 3MUX 166. Second register portion 212 also includes 3 outputs; lelocal2, driven by fourth output 3MUX 262; leout2a, driven by fifth output 3MUX 264, and leout2d; driven by sixth output 3MUX 266. Output 3MUXs 162, 164 and 166 of first register portion 112 are each driven by the output of first adder 132, an output Q1 of first register 150 and first arithmetic portion output OUT1. Thus, any of these three signals can drive an output of first register portion 112. Output 3MUXs 262, 264 and 266 of second register portion 212 are each driven by the output of second adder 232, an output Q2 of second register 250 and second arithmetic portion output OUT2. Thus, any of these three signals can drive an output of second register portion 212.

Combinatorial Implementation

It is useful to have the flexibility to switch between two nLUT circuits that may be independently programmed to implement n-input functions and two (n+1)LUT circuits that can be programmed to implement the same n+1-input functions. It may also be desirable to, with minimal added resources, have the added flexibility to select an additional option such as, for example, two LUT circuits that can implement at least some functions of n+2 inputs. LE's configured with such capabilities include what are referred to herein as shared LUT masks (or SLMs). Shared LUT masks are discussed in detail in commonly owned U.S. patent application Ser. No. 10/351,026 for Logic Circuitry with Shared Lookup Table, which is incorporated by reference in its entirety.

LE 100 includes SLM configuration. In particular, LE 100 is fracturable, that is, LE 100 includes sufficient inputs to carry out 6-input logic functions and LE 100 can be fractured to carry out two 6 or fewer input logic functions having some shared inputs. Specifically, because LE 100 includes eight signal inputs, A, B, DC0, DC1, E0, E1, F0 and F1, LE 100 can carry out two 6-input functions that share at least 4 inputs, two 5-input functions that share at least 2 inputs or two 4-input functions without sharing any inputs.

To facilitate fracturing of LE 100, inputs A and B drive each of LUTs 120, 122, 124, 220, 222 and 224. Input DC0 drives LUTs 120, 122 and 124 and second input 3MUX 270 can be configured to allow input DC0 to drive LUT 220 and the control input of 2MUX 228. First input 3MUX 170 can be configured to allow input E0 to drive 4LUT 120 and the control input of 2MUX 128. Input F0 drives the control input of 2MUXs 126 and 138. Additionally, input DC1 drives 4LUT 220, and 3LUTs 222 and 224 and first input 3MUX 170 can be configured to allow input DC1 to drive 4LUT 120 and the control input of 2MUX 128. Second input 3MUX 270 can be configured to allow input E1 to drive 4LUT 220 and the control input of 2MUX 228. And, input F1 drives the control input of 2MUXs 226 and 238.

LE 100 is fractured by appropriately configuring input 3MUXs 140, 240, 170 and 270. For example, it is possible to configure LE 100 such that the result of a first 6-input logic function Fa of signals on inputs A, B, DC0, DC1 E0 and F0 is placed on first arithmetic portion output OUT1 and the result of a second 6-input logic function Fb of signals on inputs A, B, DC0, DC1, E1 and F1 is placed on second arithmetic portion output OUT2. That is, LE 100 can be configured to carry out two 6-input functions sharing inputs A, B, DC0 and DC1. To configure LE 100 in this manner, the E0 signal is passed by input 3MUX 140 to selection inputs of 2MUX 134 and 2MUX 136. In this way, 2MUX 134 will be driven by 4LUT 120 and 4LUT 220. Similarly 2MUX 136 will be driven by 2MUXs 128 and 228. Also, input 3MUX 240 is configured to pass E1 through to selection input of 2MUX 234 and 2MUX 236. In this way, 2MUX 234 is driven by second 4LUT 120 and 4LUT 220. Similarly 2MUX 236 is driven by 2MUXs 128 and 228. Also, input 3MUX 170 is configured such that input DC1 drives first 4LUT 120 and the selection input of 2MUX 128 and input 3MUX 270 is configured such that input DC0 drives second 4LUT 220 and the selection input of 2MUX 228.

As is well understood in the art, 4LUTs 120 and 220 and 3LUTs 122, 124, 222 and 224 can be configured to carry out Fa and Fb.

LE 100 is fractured by appropriately configuring input 3MUXs 140, 240, 170 and 270. A first 5-input function Fa' of signals on inputs A, B, DC0, E0 and F0 can be carried out and provided on first arithmetic portion 110 output OUT1 and a second 5-input function Fb' of signals on inputs A, B, DC1, E1 and F1. That is, LE 100 can carry out two, 5-input functions sharing the two inputs A and B. Fracturing of LE 100 also allows a first 4-input function Fa" of signals A, DC0, E0 and F0 can be carried out and provided on first arithmetic portion 110 output OUT1 and a second 4-input function Fb" of signals on inputs B, DC1, E1 and F1. That is, LE 100 can carry out two, 4-input functions without sharing any inputs. To configure LE 100 in this manner, the GND signal is passed by input 3MUX 140 to selection inputs of 2MUX 134 and 2MUX 136. In this way, 2MUX 134 will be driven by 4LUT 120. Similarly 2MUX 136 will be driven by 2MUX 128. Also, input 3MUX 240 is configured to pass VCC through to selection input of 2MUX 234 and 2MUX 236. In this way, 2MUX 234 is driven by second 4LUT 220. Similarly 2MUX 236 is driven by 2MUX 228. Also, input 3MUX 170 is configured such that input E0 drives first 4LUT 120 and the selection input of 2MUX 128 and input 3MUX 270 is configured such that input E1 drives second 4LUT 220 and the selection input of 2MUX 228.

As is well understood in the art, 4LUT 120 and 3LUTs 122 and 124 can be configured to carry out Fa" and 4LUT 220 and 3LUTs 222 and 224 can be configured to carry out Fb".

The output of Fa" on first arithmetic portion output 138 can be provided on outputs lelocal1, leout1a and/or leout1b by appropriately configuring output 3MUXs 162, 164 and 166, respectively. Similarly, output of Fb" on second arithmetic portion output 238 can be provided on outputs lelocal2, leout2a and/or leout2b by appropriately configuring output 3MUXs 262, 264 and/or 266, respectively. The output of Fa" can also be provided to first register portion 112 through 3MUX 158 for further processing and the output of Fb" can be provided to second register portion 212 through 3MUX 258 for further processing.

Extended LUT Mode

LE 100 can generate some functions of 7-inputs by appropriately configuring input 3MUXs 140, 240, 170 and 270. For example, it is possible to configure LE 100 such that the result of a first 7-input logic function Fa''' of signals on inputs A, B, DC0, DC1 E0, E1 and F0 is placed on first arithmetic portion output OUT1. To configure LE 100 in this manner, the E0 signal is passed by input 3MUX 140 to selection inputs of 2MUX 134 and 2MUX 136. In this way, 2MUX 134 will be driven by 4LUT 120 and 4LUT 220. Similarly 2MUX 136 will be driven by 2MUXs 128 and 228. Also, input 3MUX 170 is configured such that input DC1 drives first 4LUT 120 and the selection input of 2MUX 128 and input 3MUX 270 is configured such that input E1 drives second 4LUT 220 and the selection input of 2MUX 228. In this manner output Fa''' implements the function MUX(F1(A, B, DC0, DC1, E0), F2(A, B, DC1, E0, E1)), where F0 is used as the MUX select line.

Symmetrically, it is possible to configure LE 100 such that the result of a second 7-input logic function Fb''' of signals on inputs A, B, DC0, DC1 E0, E1 and F1 is placed on second arithmetic portion output OUT2. To configure LE 100 in this manner, the E1 signal is passed by input 3MUX 240 to selection inputs of 2MUX 234 and 2MUX 236. In this way, 2MUX 234 will be driven by 4LUT 120 and 4LUT 220. Similarly 2MUX 236 will be driven by 2MUXs 128 and 228. Also, input 3MUX 170 is configured such that input E0 drives first 4LUT 120 and the selection input of 2MUX 128 and input 3MUX 270 is configured such that input DC0 drives second 4LUT 220 and the selection input of 2MUX 228. In this manner output Fb''' implements the function MUX(F1(A, B, DC0, DC1, E1), F2(A, B, DC0, E0, E1), where F1 is used as the MUX select line.

Figure 5:
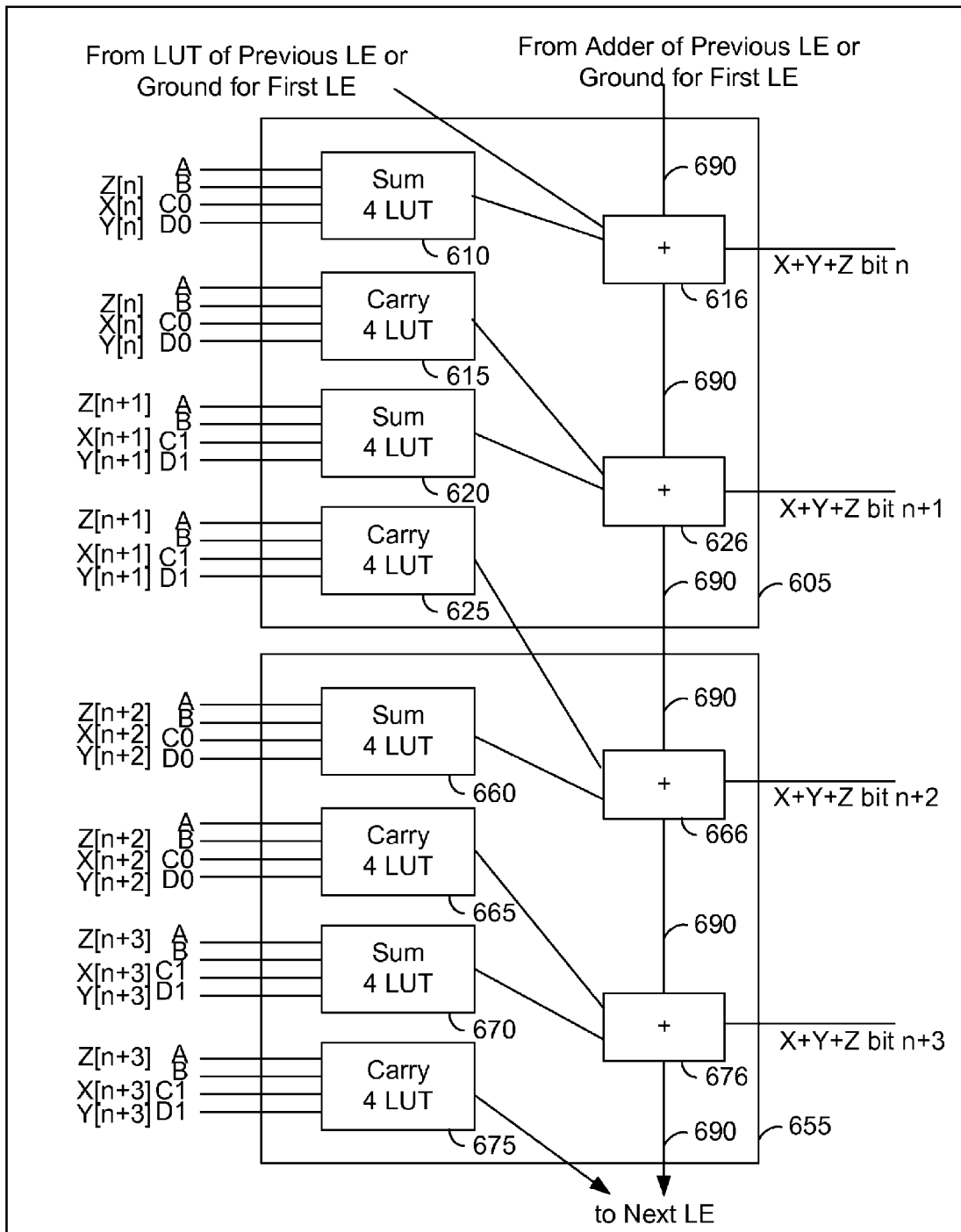
FIG. 5 illustrates yet another exemplary LE that could be used as one of the types of LEs shown in FIG. 1.

Another example of a logic circuit that could be used as a type A LE or a type B LE is shown in FIG. 5, which illustrates an LEs 605 and 655 including ternary adders. LEs 605 and 665 are disclosed in commonly owned, copending U.S. patent application Ser. No. 10/718,968 for "Logic Cell Supporting Addition of Three Binary Words" which is hereby incorporated in its entirely by reference. In FIG. 5, LE 605 includes LUTs 610, 615, 620, and 625. Additionally, it includes adders 616 and 626. Similarly, LE 655 includes LUTs 660, 665, 670, and 675. Additionally, it includes adders 666 and 676. In one embodiment, adders 666 and 676 are hardwired adders.

LUTs 610 and 615 provide the sums and carrys results for the n-th bit of the binary numbers X, Y, and Z. In other words, they provide the sums and carrys results for the X[n], Y[n], and Z[n] bits. LUTs 620 and 625 provide the sums and carrys results for the (n+1)-th bit of the binary numbers X, Y, and Z. In other words, they provide the sums and carrys results for the X[n+1], Y[n+1], and Z[n+1] bits. LUTs 660 and 665 provide the sums and carrys results for the (n+2)-th bit of the binary numbers X, Y, and Z. In other words, they provide the sums and carrys results for the X[n+2], Y[n+2], and Z[n+2] bits. LUTs 670 and 675 provide the sums and carrys results for the (n+3)-th bit of the binary numbers X, Y, and Z. In other words, they provide the sums and carrys results for the X[n+3], Y[n+3], and Z[n+3] bits.

Adder 616 receives data from LUT 610. If LE 605 is the first LE in a LAB, then adder 616 also receives ground signals. Otherwise, if LE 605 is not the first LE in a LAB, then adder 616 receives the output signals of a carry LUT (i.e., a LUT that determines the carrys for the (n−1)-th bit). Additionally, if n is not the first bit to be output as a result of adding X, Y, and Z, then adder 616 also receives a carry over signal from the previous LE. The carry over signal is received on line 690, which is part of the carry chain for adders 616, 626, 666, and 676. If n is the first bit to be output as a result of adding X, Y, and Z, then adder 616 would receive a ground signal on line 690. Adder 616 outputs the final result for the n-th bit. It also outputs a carry over signal that is sent to adder 626 via line 690.

Adder 626 receives data from LUTs 615 and 620. In other words, it receives the carries for the n-th bit and the sums for the (n+1)-th bit. Moreover, adder 626 receives the carry over signal from adder 616 via line 690. Adder 626 outputs the final result for the (n+1)-th bit. It also outputs a carry over signal that is sent to adder 666 via line 690.

Adder 666 receives data from LUTs 625 and 660. In other words, it receives the carrys for the (n+1)-th bit and the sums for the (n+2)-th bit. Moreover, adder 666 receives the carry over signal from adder 626 via line 690. Adder 666 outputs the final result for the (n+2)-th bit. It also outputs a carry over signal that is sent to adder 666 via line 690.

Adder 676 receives data from LUTs 665 and 670. In other words, it receives the carrys for the (n+2)-th bit and the sums for the (n+3)-th bit. Moreover, adder 666 receives the carry over signal from adder 666 via line 690. Adder 676 outputs the final result for the (n+3)-th bit. It also outputs a carry over signal that is sent to the first adder in the next LE via line 690.

As can be seen in FIG. 5, the output of LUT 675 is not used by either LE 605 or LE 655. Instead, the output of LUT 675, which is the carrys for the (n+3)-th bit are shared with the LE following LE 655.

Each of the Sum LUTs, such as LUTs 610, 620, 660, and 670, receives one bit of data from each of the binary numbers X, Y, and Z, and outputs a one bit signal that represents the sum of the three bits received. For example, LUT 610 receive the n-th bit of the binary numbers X, Y, and Z and outputs the sum of those three bits.

Figure 16:
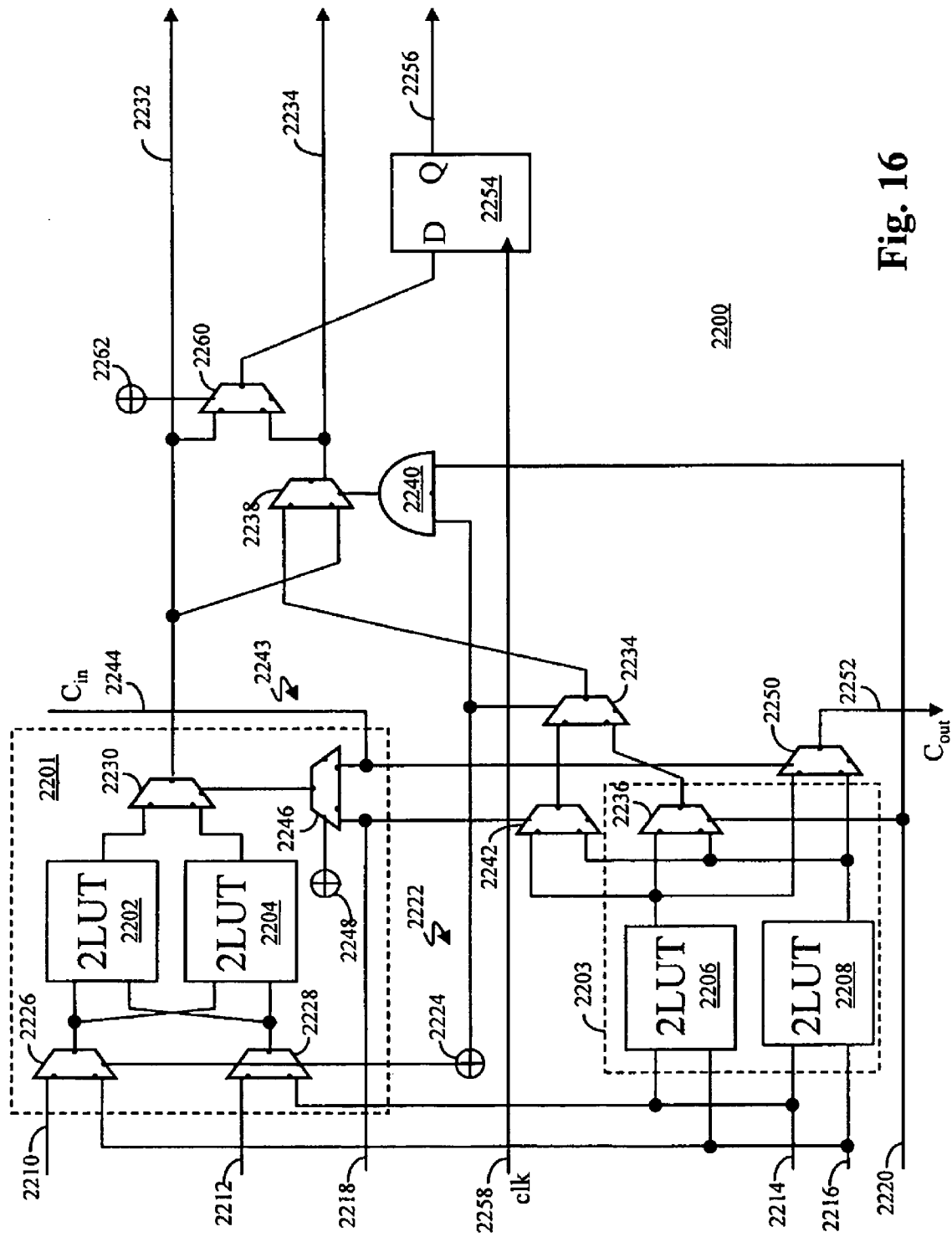
FIG. 16 illustrates yet another exemplary LE that could be used as one of the types of LEs shown in FIG. 1.

Another embodiment of an LE that can be used an either a type A LE or a type B LE is shown in FIG. 16. Logic element 2200 includes four 2-LUTs 2202, 2204, 2206, and 2208 and a set of six inputs 2210, 2212, 2214, 2216, 2218, and 2220. Each 2-LUT 2202, 2204, 2206, and 2208 includes four memory elements. Thus, logic element 2200 include's a total of 16 memory elements, which are also referred to as its LUT mask.

Logic element 2200 includes a control circuit 2222 that operates in a first mode and a second mode. In the first mode of control circuit 2222, logic element 2200 operates as a single 4-LUT, where four of the set of six inputs are used and two of the six inputs are not used. In the second mode of control circuit 2222, logic element 2200 operates as two 3-LUTs (i.e., a first 3-LUT 2201 and a second 3-LUT 2203), where a first subset of the six inputs are used for first 3-LUT 2201 and a second subset of the six inputs are used for second 3-LUT 2203, and where the inputs in the first and second subsets are distinct.

In particular, as depicted in FIG. 16, control circuit 2222 includes a control bit 2224 connected to the control inputs of MUXs 2226, 2228. Inputs 2210, 2216 are connected to MUX 2226. Inputs 2212, 2214 are connected to MUX 2228. The outputs of MUXs 2226, 2228 are connected to the inputs of 2-LUTs 2202, 2204. The outputs of 2-LUTs 2202, 2204 are connected to the inputs of MUX 2230. Inputs 2214, 2216 are also connected to the inputs of 2-LUTs 2206, 2208. The outputs of 2-LUTs 2206, 2208 are connected to the inputs of MUX 2242. Input 2218 is connected to the control input of MUX 2230 through MUX 2246. Input 2218 is also connected to the control input of MUX 2242. The output of MUX 2242 is connected to an input of MUX 2238 through MUX 2234.

The output of MUX 2230 is connected to the other input of MUX 2238. Input 2220 is connected to the control input of MUX 2238 through logic gate 2240.

Thus, when control circuit 2222 operates in the first mode, control bit 2224 controls MUXs 2226, 2228 to select inputs 2214, 2216 as the outputs of MUXs 2226, 2228 rather than inputs 2210, 2212. Thus, inputs 2214, 2216 are used as inputs of 2-LUTs 2202, 2204 as well as 2-LUTs 2206, 2208. Input 2218 controls MUXs 2230, 2242 to select among the outputs of 2-LUTs 2202, 2204, 2206, and 2208. Control bit 2224 also controls MUX 2234 to select the output of MUX 2242 as the output of MUX 2234. Input 2220 controls MUX 2238 through logic gate 2240 to select between the output of MUX 2230 and MUX 2234. Thus, output line 2234 outputs the combinatorial output of the four inputs 2214, 2216, 2218, and 2220.

When control circuit 2222 operates in the second mode, control bit 2224 controls MUXs 2226, 2228 to select inputs 2210, 2212 as the outputs of MUXs 2226, 2228 rather than inputs 2214, 2216. Thus, inputs 2210, 2212 are used as inputs of 2-LUTs 2202, 2204. Input 2218 controls MUX 2230 through MUX 2246 to select between the outputs of 2-LUTs 2202, 2204. Thus, output line 2232 outputs the combinatorial output of the three inputs 2210, 2212, and 2218.

Additionally, when control circuit 2222 operates in the second mode, inputs 2214, 2216 are used as inputs to 2-LUTs 2206, 2208. Input 2220 controls MUX 2236 to select between the outputs of 2-LUTs 2206, 2208. Control bit 2224 selects the output of MUX 2236 as the output of MUX 2234. Control bit 2224 also controls MUX 2238 through logic gate 2240 to select the output of MUX 2234 as the output of MUX 2238. Thus, output line 2234 outputs the combinatorial output of the three inputs 2214, 2216, and 2220.

In the present exemplary embodiment, logic element 2200 includes an arithmetic circuit 2243 to implement one-bit arithmetic. As depicted in FIG. 16, arithmetic circuit 2243 includes a carry-chain input ($C_{in}$) 2244, which is generated by a previous logic element, connected to an input of MUX 2246. A control bit 2248 controls MUX 2246 to select between input 2218 and carry-chain input 2244. The output of MUX 2246 controls MUX 2230. Thus, in an arithmetic mode, MUX 2230 can produce an arithmetic sum based on inputs to 2-LUTs 2202, 2204 and carry-chain input 2244. As also depicted in FIG. 16, carry-chain input 2244 controls MUX 2250 to generate a carry-chain output ($C_{out}$) 2252, which feeds a subsequent logic element.

In the present exemplary embodiment, logic element 2200 includes a flip-flop 2254 to produce a registered output on output line 2256. As depicted in FIG. 16, flip-flop 2254 receives a clock signal 2258, and the data input of flip-flop 2254 is connected to the output of MUX 2260. A control bit 2262 controls MUX 2260 to select between the outputs of MUX 2230, which outputs the combinatorial output of the three inputs 2210, 2212, 2218, and MUX 2238, which outputs the combinatory output of the four inputs 2214, 2216, 2218, and 2220. Thus, output line 2256 outputs the registered output of either three inputs 2210, 2212, and 2218 or four inputs 2214, 2216, 2218, and 2220.

Figure 17:
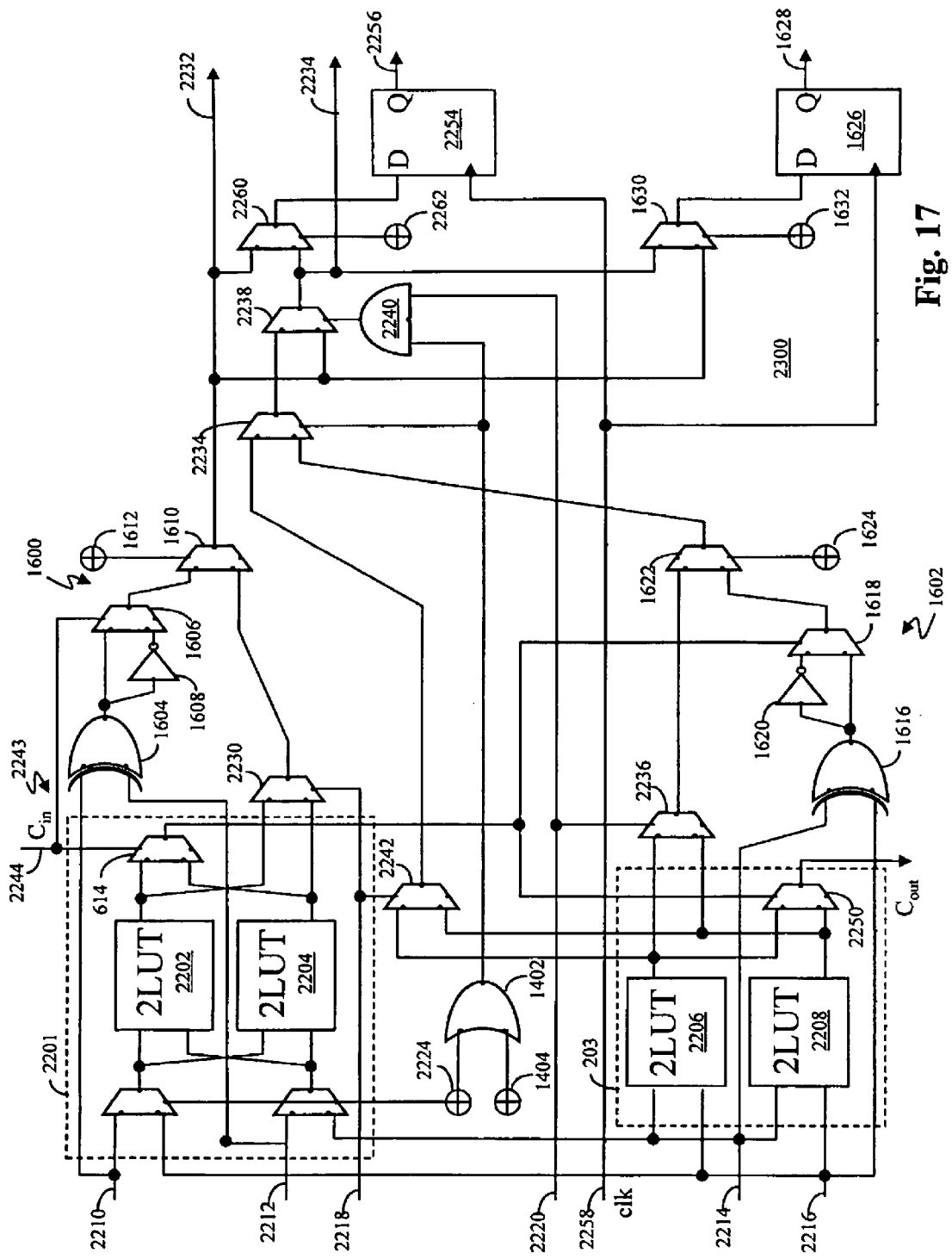
FIG. 17 illustrates yet another exemplary LE that could be used as one of the types of LEs shown in FIG. 1.

Another embodiment of an LE that can be used an either a type A LE or a type B LE is shown in FIG. 17. LE 2300 includes the features of LE 2200 with the addition of a logic gate 1402 to implement a 4:1 multiplexing mode. As depicted in FIG. 17, logic gate 1402 is an OR gate with inputs connected to control bits 1224, 1404 and an output connected to an input of logic gate 2240 and the control input of MUX 2234.

To operate in the 4:1 multiplexing mode, control bit 2224 controls MUXs 2226, 2228 to select inputs 2210, 2212. Input 2218 controls MUX 2230 through MUX 2246 to select between inputs 2210, 2212. Input 2218 also controls MUX 2242 to select between inputs 2214, 2216. Control bit 1404 is set appropriately to control MUX 2234 to select the output of MUX 2242 as the output to MUX 2234 and to force input 2220 to control MUX 2238 through logic gate 2240. Thus, input 2220 controls MUX 2238 to select between the outputs of MUX 2230 (inputs 2210, 2212) and MUX 2234 (inputs 2214, 2216). Note that the order of the MUXs (e.g., MUX 2226) can be modified so that this controlling behavior is possible while maintaining the dual usage of the SRAM configuration bits.

Logic element 2300 additionally includes arithmetic circuit 2243 comprised of adder circuits 1600, 1602 to implement two-bits of arithmetic. Logic element 2300 also includes a second flip-flop 1626 and a fourth output line 1628.

Adder circuit 1600 includes an exclusive OR (XOR) 1604 with inputs connected to inputs 2210, 2212. The inputs of MUX 1606 receive the output of XOR 1604 and an inverse of the output of XOR 1604 through inverter 1608. The control input of MUX 1606 is connected to carry-chain input 2244. Thus, in an arithmetic mode, MUX 1606 can produce an arithmetic sum based on inputs 2210, 2212 and carry-chain input 2244. The inputs of MUX 1610 are connected to the outputs of MUX 1606 and MUX 2230. The control input of MUX 1610 is connected to a control bit 1612. Thus, control bit 1612 controls MUX 1610 to select between the sum produced by MUX 1606 and the output of MUX 2230.

Adder circuit 1602 includes an XOR 1616 with inputs connected to inputs 2214, 2216. The inputs of MUX 1618 receive the output of XOR 1616 and an inverse of the output of XOR 1616 through inverter 1620. Thus, in an arithmetic mode, MUX 1618 can produce an arithmetic sum based on inputs 2214, 2216. The inputs of MUX 1622 are connected to the outputs of MUX 1618 and MUX 2236. The control input of MUX 1622 is connected to a control bit 1624. Thus, control bit 1624 controls MUX 1622 to select between the sum produced by MUX 1618 and the output of MUX 2236.

In the present exemplary embodiment, logic element 2300 includes second flip-flop 1626 to produce a second registered output on output line 1628. As depicted in FIG. 17, flip-flop 1626 receives clock signal 2258, and the data input of flip-flop 1626 is connected to the output of MUX 1630. A control bit 1632 controls MUX 1630 to select between the outputs of MUX 1610 and MUX 2238.

Figure 6A:
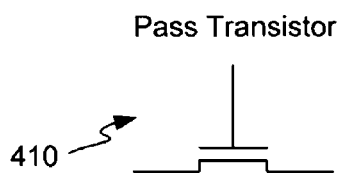
FIGS. 6A-6D illustrate different exemplary switching implementations that could be used in the different types of LEs used in the LAB shown in FIG. 1.
Figure 6B:
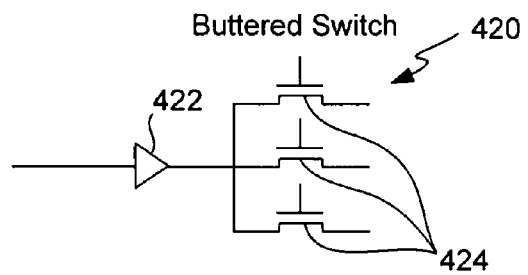
Figure 6C:
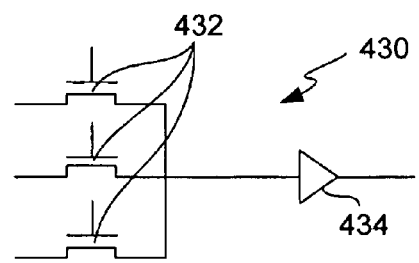
Figure 6D:
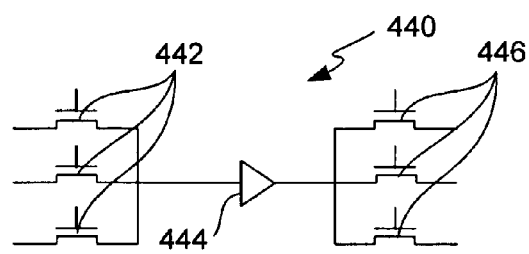

It is also considered that a LAB in accordance with the present invention include two different types of LEs that differ from each other is ways other than the ways LEs 500, 300, 100 and/or 605 differ. For example, in a LAB in accordance with the present inventions, an LE of a first type may use different transistor level switching than a second type of LE. FIGS. 6a through 6d illustrate exemplary different devices for implementing programmable switches in an LE. FIG. 6a illustrates a pass transistor 410 which is relatively slow but also relatively small. FIG. 6b illustrates a buffered switch 420 which includes a buffer 422 driving 3 parallel transistors 424. While relatively larger than the pass transistor, buffered switch 420 typically has improved electrical properties when cascaded for example, for example buffered switch 420 exhibits improved delay over pass transistor 410. FIG. 6c illustrates a direct drive switch 430 which includes three transistors 432 connected in parallel driving a buffer 434. Direct drive switch 430 is smaller than buffered switch 420 and faster than pass transistor 410, however, it is relatively less flexible, that is, direct-drive switch 430 only has a single output. FIG. 6d illustrates a MUX-deMUX switch 440 including three first parallel transistors 442 driving a buffer 444 that drives three second parallel transistors 446. MUX-DeMUX switch 440 is more versatile than either buffered switch 420 or direct drive switch 430 in that it includes three inputs and three outputs. MUX-DeMUX switch 440, however, is larger than either buffered switch 420 or direct-drive switch 430.

In accordance with the present invention, a LAB architecture such as LAB 100 including a first and second type of LE may include a first type of LE including LE 300 constructed using pass transistors such as pass transistor 410, shown in FIG. 6a, and a second type of LE including LE 300 constructed using buffered switches, such as buffered switch 420. It is also considered that any other type of transistor level implementation be included in a first type of LE and while a different type of transistor level implementation be included in a second type of LE. Any of the types of transistor level implementations illustrated in FIG. 6a through 6d may be used or any other devices implementing programmable switches may be used.

It is also considered that a LAB in a PLD include more than two types of LEs. For example, LEs 22 and 24 of LAB 10 shown in FIG. 1 could be of a third type C LE that is different from both type A LEs and type B LEs. The differences between type A LEs, type B LEs and type C LEs may be any of the differences discussed above with respect to type A LEs and type B LEs of LAB 100. It is also considered that more that 3 types of LE's be included in a single LAB.

Figure 7:
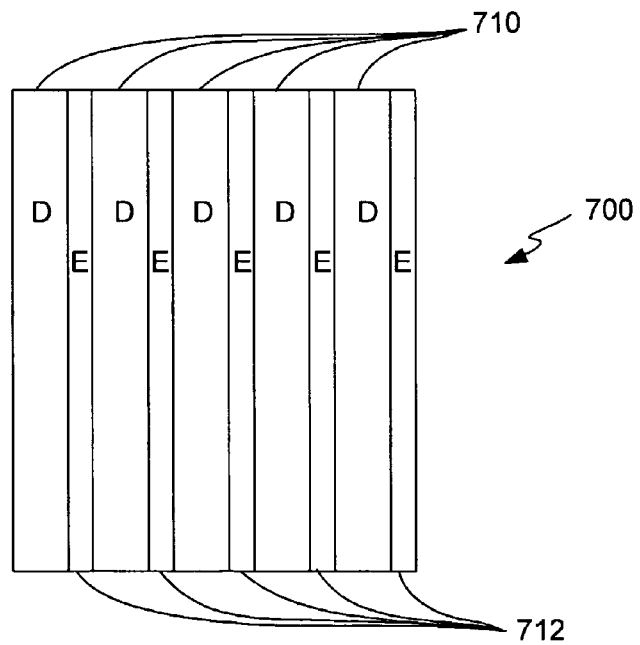
FIG. 7 illustrates a programmable logic device (PLD) including columns having different types of LABs in accordance with the present invention.

A PLD in accordance with the present invention may also include a first and second type of LAB. One embodiment of such a PLD architecture is illustrated in FIG. 7 which shows a PLD 700 including a first set of columns 710 having a LAB of type D and a second set of columns 712 including a LAB of type E where type D LABs are different from type E LABs. Each column of first and second sets of columns 910 and 912 preferably include hundreds or thousands of LABs, however any number of LABs may be included in each column.

Figure 8:
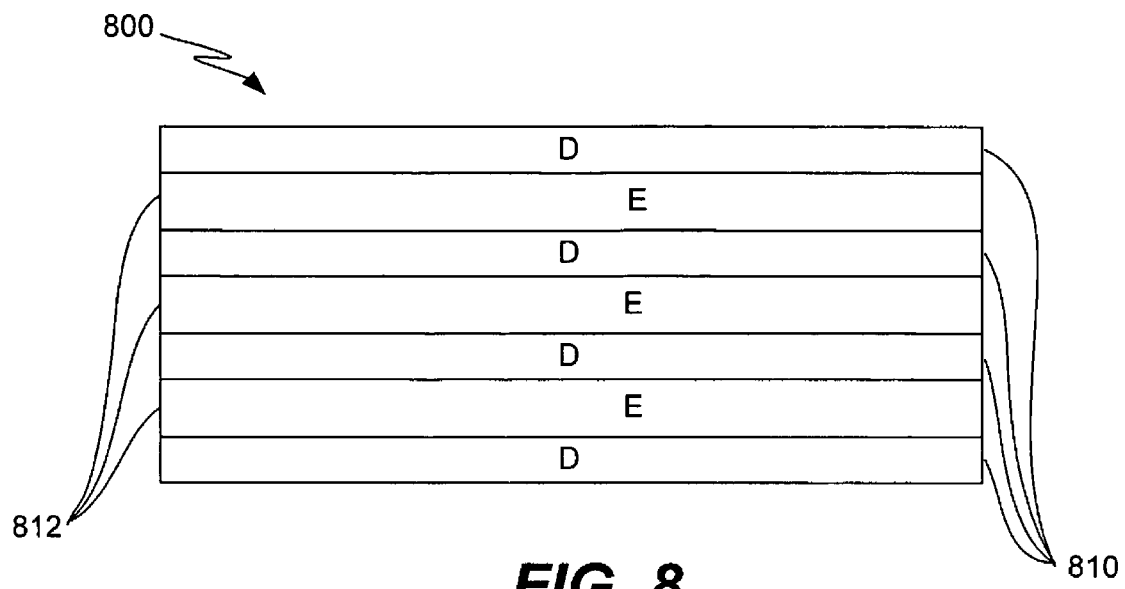
FIG. 8 illustrates a PLD including rows having different types of LABs in accordance with the present invention.
Figure 9:
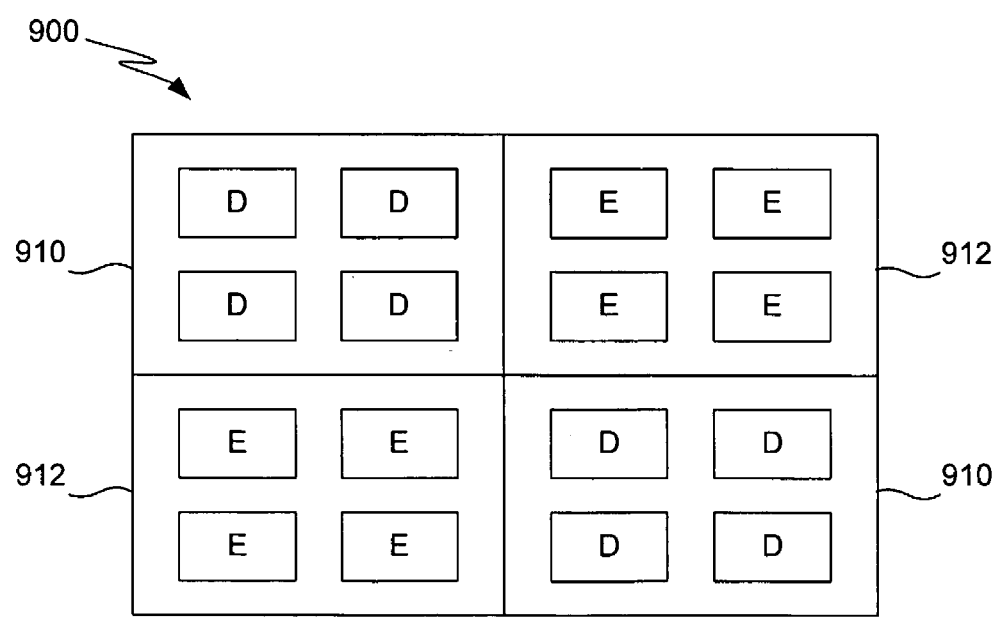
FIG. 9 illustrates a PLD including regions having different types of LABs in accordance with the present invention.

Different LABs may also be included in different rows of a PLD or different regions of a PLD. FIG. 8 illustrated a PLD 800 including a first set of rows 810 having LAB type D and a second set of rows 812 having a LAB type E. Each row of first and second sets of rows 810 and 812 preferably include hundreds or thousands of LABs, however any number of LABs may be included in each row. FIG. 9 illustrates a PLD 900 including a first set of regions 910 having LABs of type D and a second set of regions 912 having LABs of type E.

Figure 10:
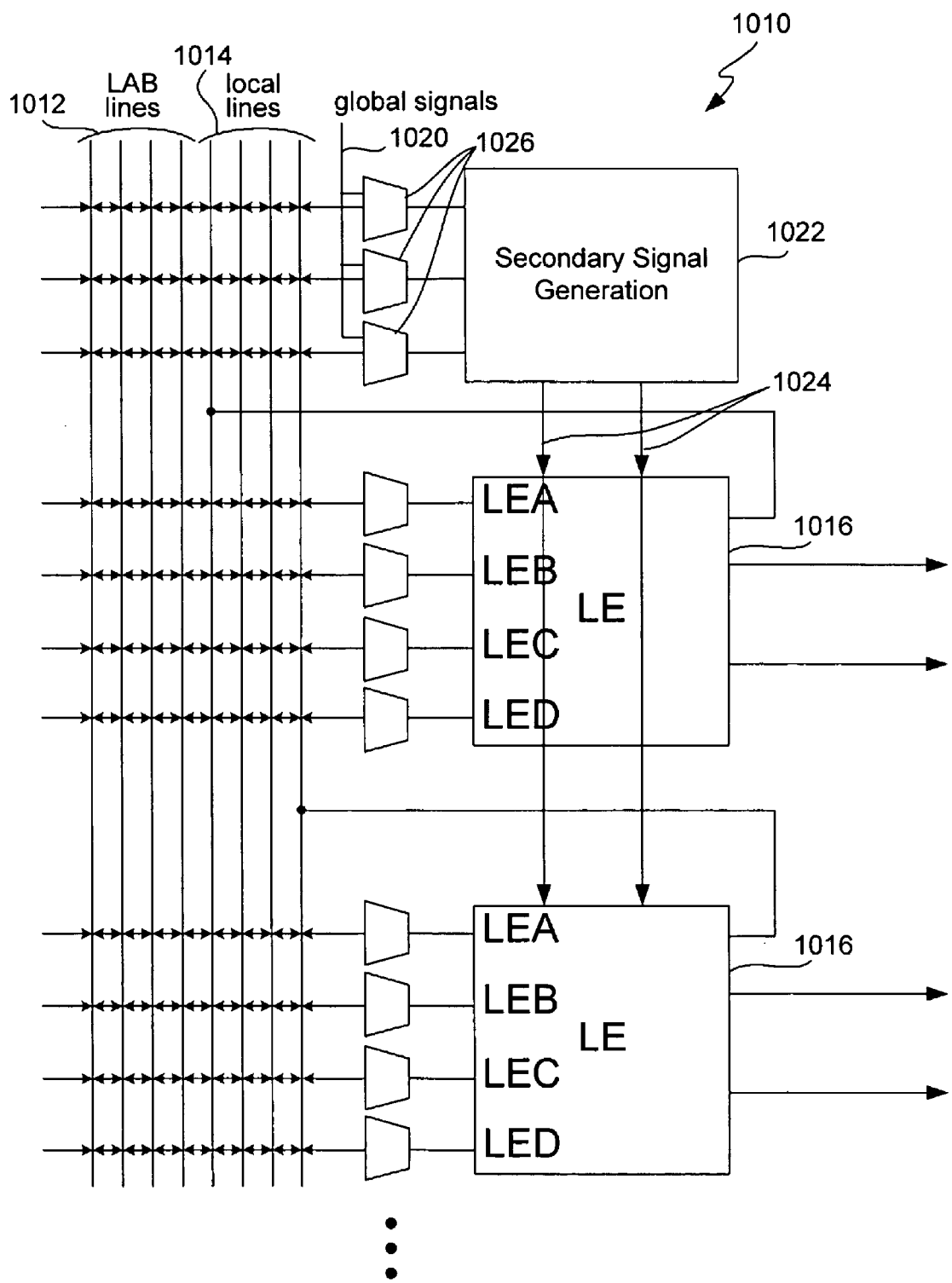
FIG. 10 illustrates an exemplary LAB that could be used as one of the types of LABs of the PLDs shown in FIGS. 7 through 9.
Figure 11:
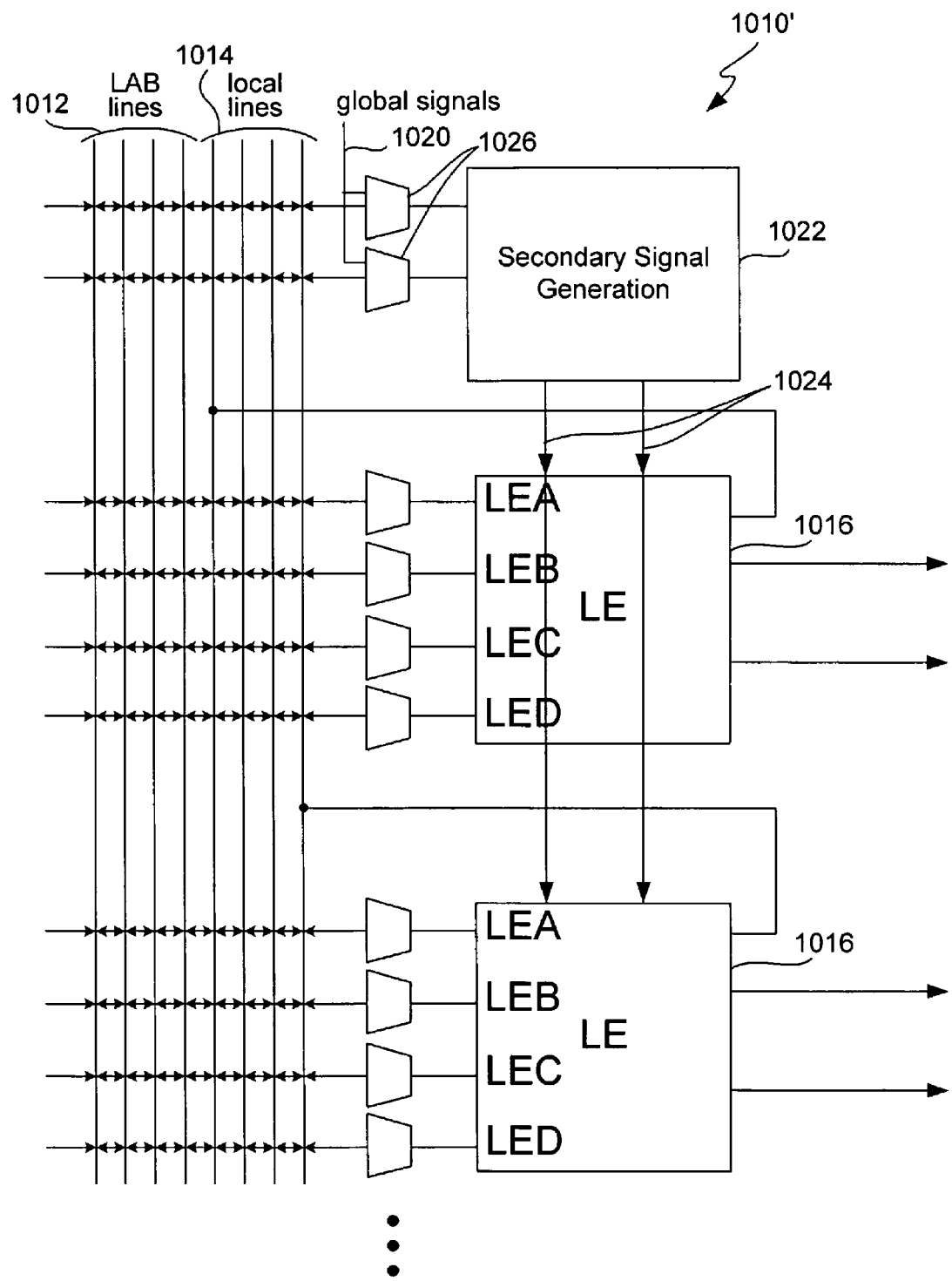
FIG. 11 illustrates another exemplary LAB that could be used as one of the types of LABs of the PLDs shown in FIGS. 7 through 9.

First LAB type D may, for example, include LE's of all type A and LAB type E may include all LEs of type B or C or a combination thereof. In another embodiment, both LAB type D and LAB type E include the same types of LEs but are otherwise different. For example both LAB type D and LAB type E could include the same types of LEs such as LE 2300, however, LAB type D could include local lines that are shared among LEs and LAB type E could include LABs such as LAB 2200 shown in FIG. 16 having dedicated local lines (and including only a single type of LE). Another way in which LAB type D could differ from LAB type E is illustrated in FIGS. 10 and 11. FIG. 10 shows a portion of a LAB 1010 including LEs 1016, which can be the same as each other and the same as all the other LEs in LAB 1010. LEs 1016 may be, for example, the same as any one of LEs 100, 200, 500, 605, 2200 and/or 2300 discussed above. LAB 1010 also includes LAB lines 1012 and local lines 1014, the purpose of which have been discussed above. As would be understood by one of ordinary skill, and as discussed above, LE's use global secondary signals such as, for example, clock, asynchronous load, asynchronous data, synchronous load, synchronous data, and asynchronous clear, for register and look up table functions. And, as would also be understood by one of ordinary skill, different LEs, or different portions of a single LE, may use different global secondary signals. In the embodiment of FIG. 10, global signal lines 1020, which may be multiple conductor lines, provide these global secondary signals to LAB 1010. In particular, global signals are provided by global signal lines 1020 to global MUXs 1026 which feed secondary signal generation 1022. As one of ordinary skill would understand, secondary signal generation 1022 distributes global signals to LEs 1016 of LAB 1010 through signal lines 1024, which may be multiple conductor lines. Secondary signal generation 1022 can also receive global secondary signals from LAB lines 1012 and local lines 1014 through global signal MUXs 1026. Signals received from LAB lines 1012 and local lines 1014 may also be distributed on lines 1024 to LEs 1016 by secondary signal generation 1022.

FIG. 11 illustrates a LAB 1010' that is similar to LAB 1010 shown in FIG. 10. In particular, LAB 1010' includes LEs 1016 that can receive signals from LAB lines 1012 and local lines 1014. LAB 1010' also includes global signal lines 1020 for carrying global secondary signals which can be received by secondary signal generation 1022 to be provided to LEs 1016. LAB 1010', however, is different from LAB 1010 in that LAB 1010 includes three global signal MUXs 1026 and LAB 1010' includes only two global signal MUXs 1026. Thus, the LE's of LAB 1010 will have a greater number of global signals available to them than the LE's of LAB 1010'. Providing fewer global signal MUXs 1026 can reduce area requirements for a LAB but may also reduce versatility of the LAB.

Figure 12:
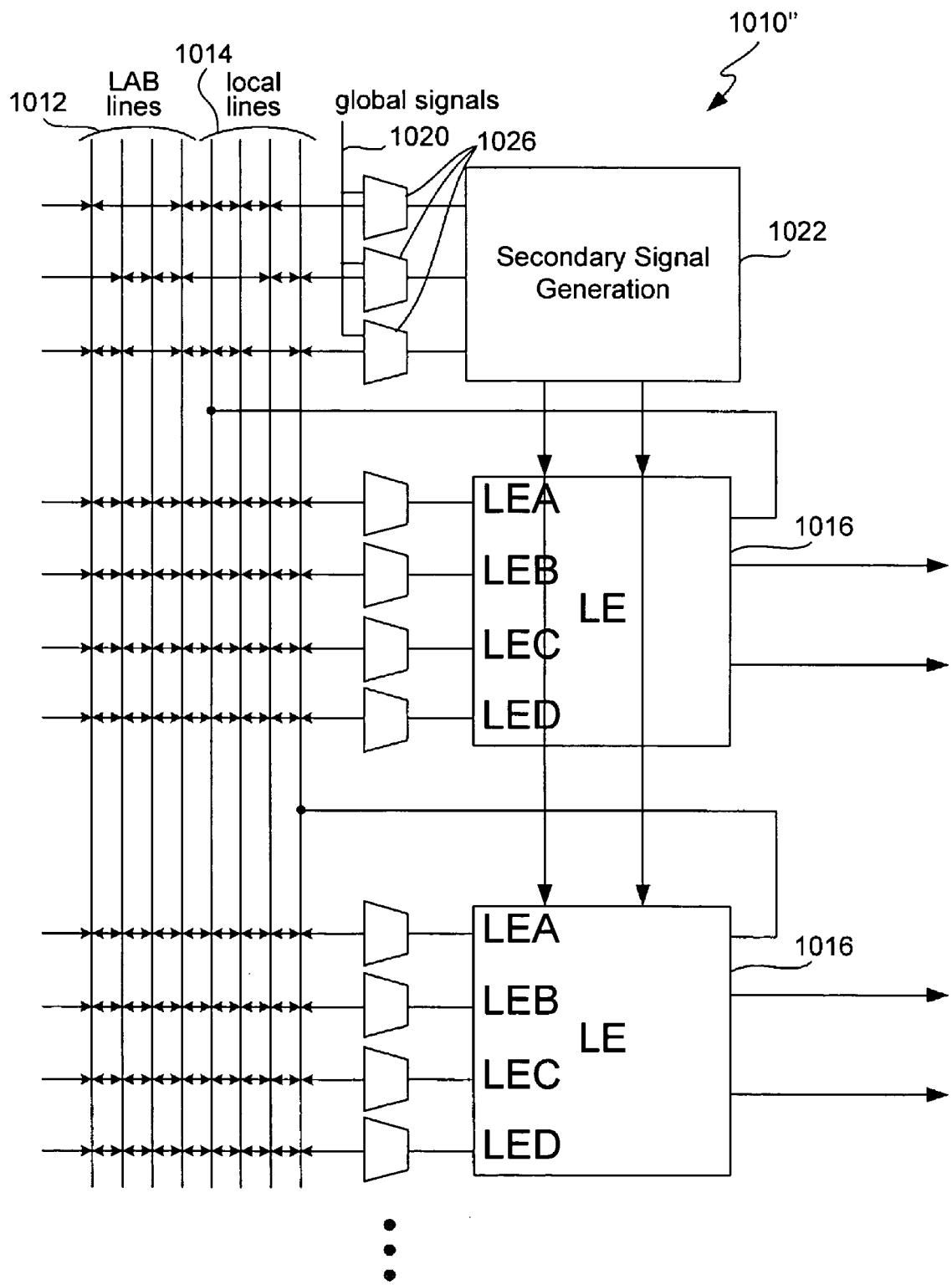
FIG. 12 illustrates yet another exemplary LAB that could be used as one of the types of LABs of the PLDs shown in FIGS. 7 through 9.

FIG. 12 illustrates a LAB 1010" that is also similar to LAB 1010 shown in FIG. 10. In particular, LAB 1010" includes LEs 1016 that can receive signals from LAB lines 1012 and local lines 1014. LAB 1010" also includes global signal lines 1020 carrying global secondary signals which can be received by secondary signal generation 1022 to be provided to LEs 1016. LAB 1010", however, is different from LAB 1010 in that the LAB lines 1012 and local lines 1014 of LAB 1010 include a complete set of interconnections to global signal MUXs 1026 while the LAB lines 1012 and local lines 1014 of LAB 1010" have reduced connectivity to global signal MUXs 1026. In particular, in FIGS. 10 and 12, X's located at intersections of illustrated LAB lines 1012 and local lines 1014 with input lines to global signal MUXs 1026 indicate that a LAB line 1012 or local line 1014 can be interconnected to an input line to global signal MUXs 1026 at that intersection. As shown in FIG. 12, fewer such possible interconnectable intersections are available in LAB 1010" than in LAB 1010. This can reduce the area required for LAB 1010" but may also reduce the versatility of LAB 1010".

Figure 13:
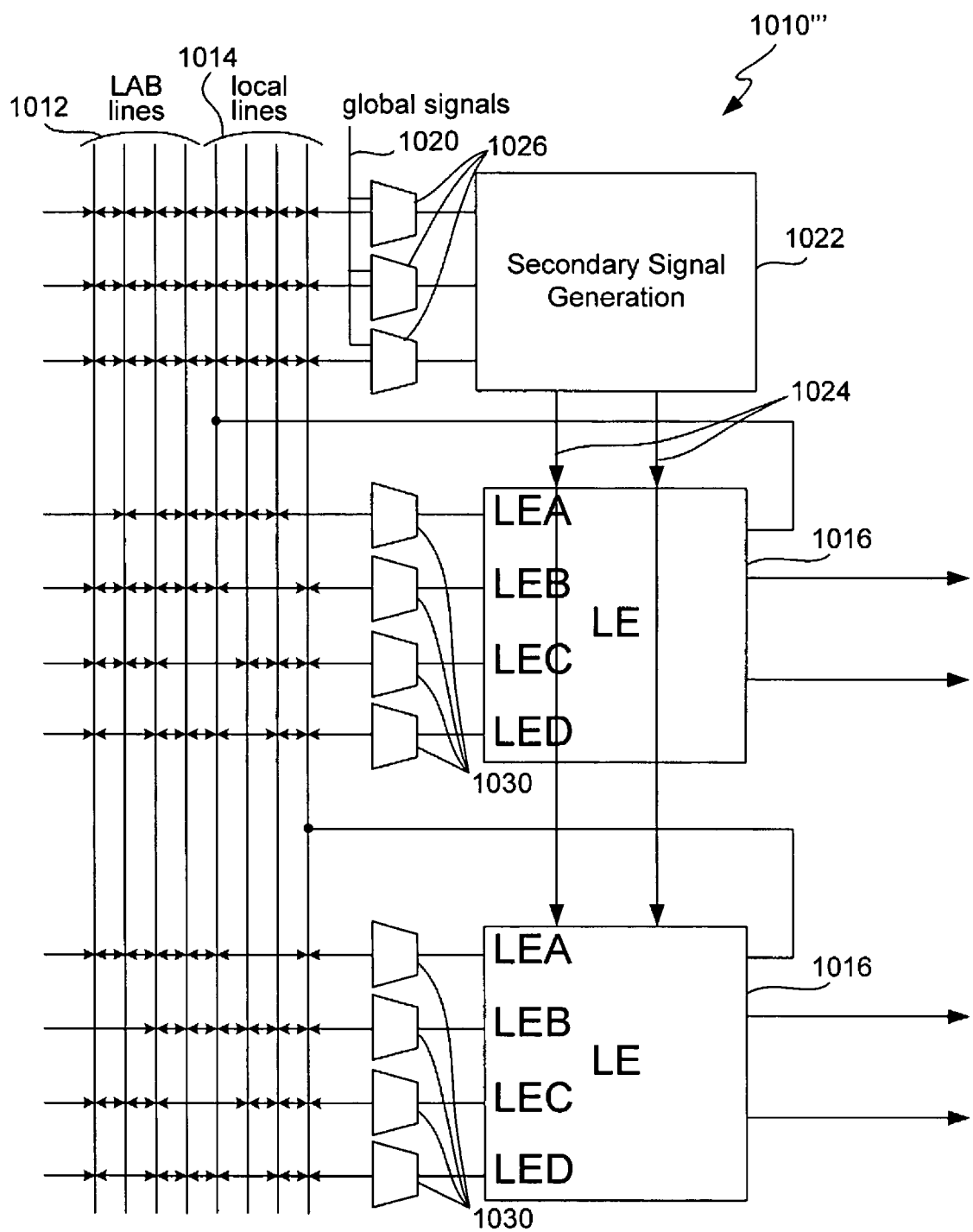
FIG. 13 illustrates still another exemplary LAB that could be used as one of the types of LABs of the PLDs shown in FIGS. 7 through 9.

FIG. 13 illustrates a LAB 1010''' that is also similar to LAB 1010 shown in FIG. 10. In particular, LAB 1010''' includes LEs 1016 that can receive signals from LAB lines 1012 and local lines 1014. LAB 1010''' also includes global signals 1020 for carrying global secondary signals which can be received by secondary signal generation 1022 to be provided to LEs 1016. LAB 1010''', however, is different from LAB 1010 in that the LAB lines 1012 and local lines 1014 of LAB 1010 include a complete set of interconnections to LEs 1016 while the LAB lines 1012 and local lines 1014 of LAB 1010' have reduced connectivity to LEs 1016. In particular, in FIGS. 10 and 13, X's located at intersections of illustrated LAB lines 1012 and local lines 1014 with input lines to LE input MUXs 1030 indicate that a LAB line 1012 or local line 1014 can be interconnected to an input line to LE input MUXs 1030 at that intersection. As shown in FIG. 13, fewer such possible interconnectable intersections are available in LAB 1010''' than in LAB 1010. This can reduce the area required for LAB 1010''' but may also reduce the versatility of LAB 1010'.

Figures 14A, 14B:
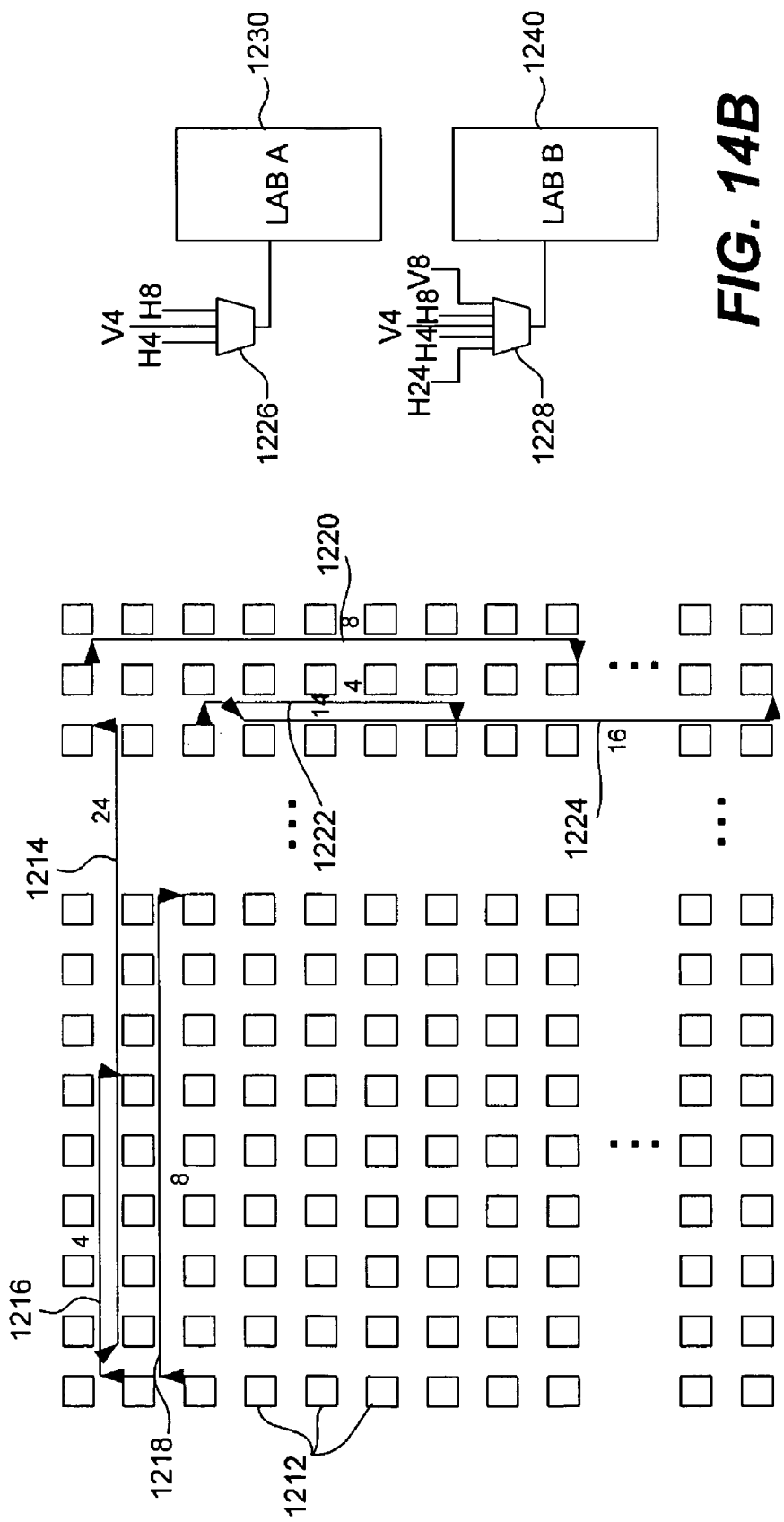
FIG. 14a illustrates a layout of a PLD showing exemplary horizontal and vertical lines interconnecting LABs.
FIG. 14b illustrates first and second exemplary types of LABs that could be used in the PLD shown in FIG. 14a in accordance with the present invention.

FIG. 14a illustrates routing of vertical and horizontal lines between LABs in a PLD. In particular, FIG. 14a illustrates a portion of a PLD 1210 including a plurality of LABs 1212. As understood by those of ordinary skill in the art, LABs 1212 are interconnected by multiconductor horizontal and vertical lines. While most horizontal and vertical lines of LAB 1210 are not shown in FIG. 1210, a few exemplary such lines are illustrated. FIG. 14a illustrates horizontal line 1214 including 24 discrete conductors, horizontal line 1216 including 4 discrete conductors and horizontal line 1218 including 8 discrete conductors. FIG. 14a also illustrates vertical line 1220 including 8 discrete conductors, vertical line 1222 including 4 discrete conductors and vertical lines 1224 including 16 discrete conductors. In accordance with the present invention, different horizontal and vertical lines may be available to different labs through LAB input MUXs. For example, FIG. 14b illustrates LAB 1230 interconnected with LAB input MUX 1226. Additional LAB input MUXs would also drive LAB 1230, however, only LAB input MUX 1226 is shown. LAB input MUX 1226 is driven by a 4 conductor horizontal line H4, a 4 conductor vertical line V4 and an 8 conductor horizontal line H8. FIG. 14b illustrates LAB 1240 of PLD 1210 which is driven by LAB input MUX 1228. Additional LAB input MUXs would also drive LAB 1240, however, only LAB input MUX 1228 is shown. In addition to 4 conductor horizontal line H4, 4 conductor vertical line V4 and 8 conductor horizontal line H8, LAB 1240 input MUX 1228 is also driven by a 24 conductor horizontal line H24 and an 8 conductor vertical line V8. Accordingly, LAB A is different from LAB B in that it has access to a greater number of LAB routing lines, or greater routing flexibility.

In accordance with the present inventions, LABs type D and type E shown in FIGS. 7, 8 and 9 may, for example, be any of LABs 1010, 1010', 1010'', 1230 and/or 1240. LABs type D and type E may also be any other LABs that are different from each other.

Figure 15:
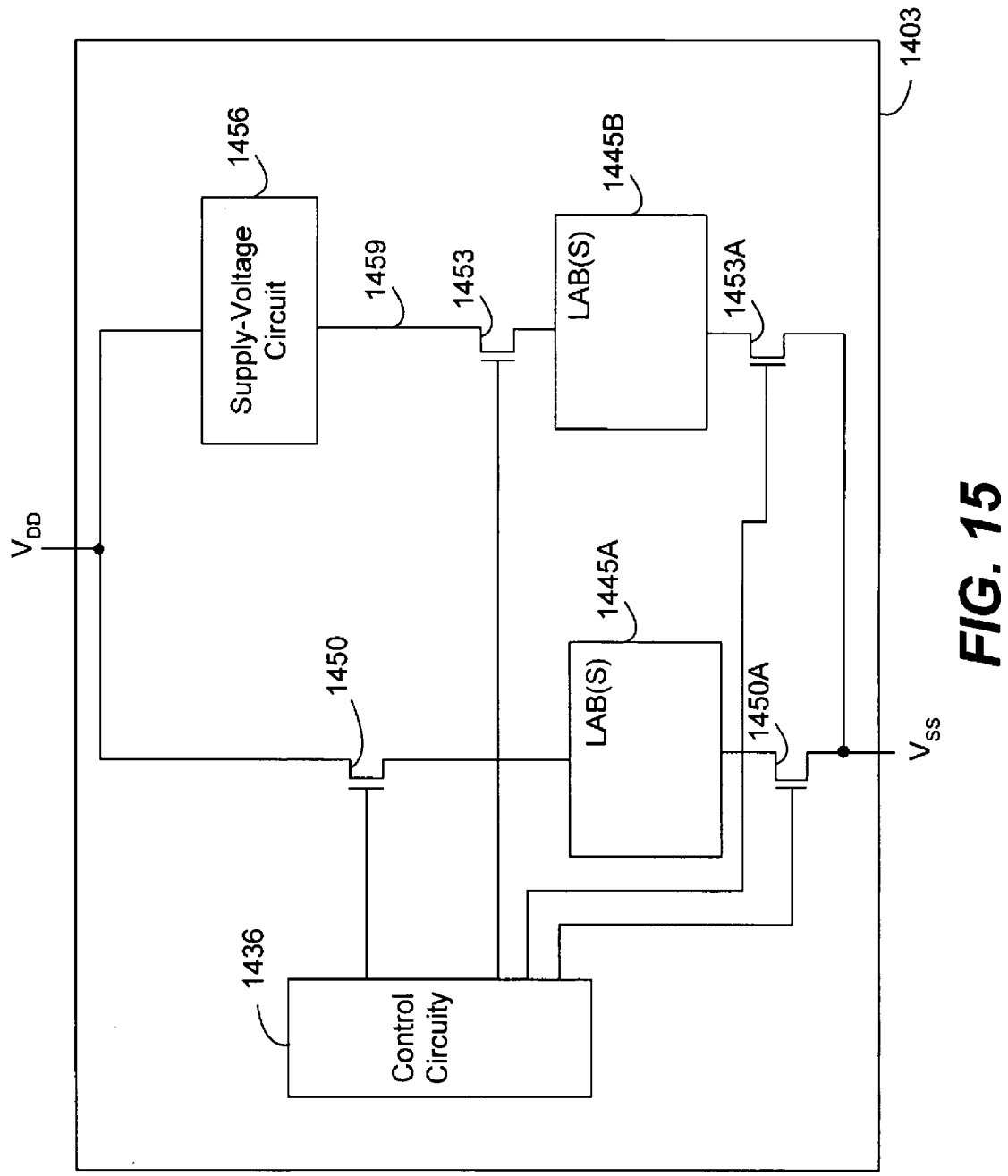
FIG. 15 illustrates a portion of a PLD including circuitry for powering down one or more LABs in the PLD in accordance with the present invention.

FIG. 15 shows a block diagram of a portion of a PLD 1403 including a circuit for selectively turning off LABs or other circuitry or reducing or generally controlling power consumption of circuitry within PLD 1403 according to exemplary embodiments of the invention. The circuit includes control circuitry 1436, transistor 1450, and LAB(s) 1445A. In addition, the circuit may include transistor 1450A, transistor 1453, supply-voltage circuit 1456, transistor 1453A, and LAB(s) 1445B.

Suppose that one wishes to shut down LAB(s) 1445A. Transistor 1450 couples LAB(s) 1445A to the supply voltage $V_{DD}$. In other words, when transistor 1450 is ON, LAB(s) 1445A receive(s) the supply voltage $V_{DD}$, and vice-versa. Transistor 1450 turns ON and OFF in response to a control signal from control circuitry 1436. Thus, to turn off LAB(s) 1445A, one causes control circuitry 1436 to de-assert the gate signal of transistor 1450 and interrupt the supply voltage to LAB(s) 1445A. Causing control circuitry 1436 to de-assert the gate of a transistor would be understood by one of ordinary skill in the art. One may subsequently turn ON LAB(s) 1445A by asserting the gate signal of transistor 1450 under the supervision of control circuitry 1436.

Note that, rather than turning transistor 1450 OFF or ON, one may control the gate voltage of transistor 1450 so as to use transistor 1450 as a variable impedance device. Thus, transistor 1450 may at extremes have relatively high impedance (OFF state), relatively low impedance (ON state), or an impedance level between those two states. As a result, one may not only turn OFF and ON LAB(s) 1445A, but also control power dissipation within those circuit(s) by controlling the impedance of transistor 1450.

In addition to, or instead of, using transistor 1450 to control the provision of supply voltage, $V_{DD}$, to LAB(s) 1445A (whether turning OFF, ON, or anything in between those extremes, as described above), one may use transistor 1450A to control the provision of supply voltage $V_{SS}$ (typically circuit ground). The details of operation are similar to those described above with respect to transistor 1450 and supply voltage $V_{DD}$, as persons of ordinary skill in the art who have the benefit of the description of the invention understand.

PLD 1403 may use more than one supply voltage, as desired. In other words, one may optionally use supply-voltage circuit 1456 to generate secondary supply-voltage 1459 from the primary supply voltage, $V_{DD}$. Secondary supply-voltage 1459 may have a smaller or larger magnitude than the primary supply voltage, as desired. Furthermore, one may use more than one secondary supply-voltage, as desired. Secondary supply-voltage 1445B powers PLD circuit 1445B. One may shut down or power up LAB(s) 1445B by, respectively, de-asserting and asserting the gate signal of transistor 1453 under the supervision of control circuitry 136.

Note that, rather than turning transistor 1453 OFF or ON, one may control the gate voltage of transistor 1453 so as to use it as a variable impedance device. Thus, transistor 1453 may at extremes have relatively high impedance (OFF state), relatively low impedance (ON state), or an impedance level between those two states. As a result, one may not only turn OFF and ON LAB(s) 1445B, but also control power dissipation within those circuit(s) by controlling the impedance of transistor 1453.

In addition to, or instead of, using transistor 1453 to control the provision of secondary supply voltage 1459 to LAB(s) 1445B (whether turning OFF, ON, or anything in between those extremes, as described above), one may use transistor 1453A to control the provision of supply voltage $V_{SS}$ (typically circuit ground). The details of operation are similar to those described above with respect to transistor 1453 and secondary supply-voltage 1459, as persons of ordinary skill in the art who have the benefit of the description of the invention understand.

In accordance with the present inventions LAB type D shown in FIGS. 7, 8 and 9, can differ from LAB type E in that LAB type D of a PLD may be LAB(s) 1445A and/or 1445B shown in FIG. 15. That is LAB type D may include power down circuitry as illustrated in FIG. 15, and LAB type E would not include such circuitry.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

What is claimed as new and desired to be protected by Letters Patent of the United States is:

1. A programmable logic device ("PLD") including:
    at least one logic block, the one logic block including:
        at least one lookup table ("LUT") based logic element ("LE") of a first type; and
        at least one LUT based LE of a second type, wherein the first type of LE has a different hardware design from the second type of LE, wherein the first type of LE and the second type of LE reside at the same time within the PLD, wherein the first type of LE has a first number of inputs and uses less than the first number of inputs and the second type of LE has a second number of inputs and uses all of the second number of inputs, wherein each of the first and second type of LE is configured to perform arithmetic and the first type of LE is configured to perform a lower number of bits of arithmetic than the second type of LE.

2. The PLD of claim 1, wherein the first type of LE includes a lower number of registers than the second type of LE.

3. The PLD of claim 1, wherein the first type of LE includes at least a first type of LUT and the second type of LE includes at least a second type of LUT, wherein the first type of LUT includes a different number of inputs than the second type of LUT.

4. The PLD of claim 1, wherein the first type of LE is fracturable and the second type of LE is not fracturable.

5. The PLD of claim 4, wherein the first type of LE includes a first type of LUT and the second LE includes a second type of LUT, the first type of LUT having a different number of fracturable inputs than the second type of LUT.

6. The PLD of claim 1, wherein the first type of LE includes a first type of dedicated arithmetic hardware and the second type of LE includes a second type of dedicated arithmetic hardware, the first type of dedicated arithmetic hardware being different from the second type of dedicated arithmetic hardware.

7. The PLD of claim 1, wherein the first type of LE includes dedicated arithmetic hardware and the second type of LE does not include dedicated arithmetic hardware.

8. The PLD of claim 1, wherein the first type of LE receives at least one different type of secondary signal than the second type of LE.

9. The PLD of claim 1, wherein the first type of LE includes a different number of output drivers than the second type of LE.

10. The PLD of claim 1, wherein the first type of LE includes a first type of output driver and the second type of LE includes a second type of output driver wherein the first type of output driver is different from the second type of output driver.

11. The PLD of claim 1, wherein the first type of LE is implemented using a different transistor level switching implementation than the second type of LE.

12. The PLD of claim 11, wherein the first type of LE uses relatively faster transistor level switches than the second type of LE.

13. The PLD of claim 11, wherein the first type of LE uses relatively more power efficient transistor level switches than the second type of LE.

14. The PLD of claim 1, wherein the first type of LE is relatively faster than the second type of LE.

15. A programmable logic device ("PLD") comprising:
at least one logic block, the one logic block including:
   at least one lookup table ("LUT") based logic element ("LE") of a first type; and
   at least one LUT based LE of a second type, wherein the first type of LE has a different hardware design from the second type of LE, wherein the first type of LE and the second type of LE reside at the same time within the PLD, wherein the first type of LE has a first number of inputs and uses less than the first number of inputs and the second type of LE has a second number of inputs and uses all of the second number of inputs, wherein the first type of LE includes a first type of register and the second type of LE includes a second type of register, the first type of register including a register cascade input and a register cascade output and the second type of LE having neither a register cascade input or a register cascade output.

16. A programmable logic device ("PLD") comprising:
at least one logic block, the one logic block including:
   at least one lookup table ("LUT") based logic element ("LE") of a first type; and
   at least one LUT based LE of a second type, wherein the first type of LE has a different hardware design from the second type of LE, wherein the first type of LE and the second type of LE reside at the same time within the PLD, wherein the first type of LE has a first number of inputs and uses less than the first number of inputs and the second type of LE has a second number of inputs and uses all of the second number of inputs, wherein the first type of LE includes a ternary adder circuit and the second type of LE does not include a ternary adder circuit.

17. A programmable logic device ("PLD") comprising:
at least one logic block, the one logic block including:
   at least one lookup table ("LUT") based logic element ("LE") of a first type; and
   at least one LUT based LE of a second type, wherein the first type of LE has a different hardware design from the second type of LE, wherein the first type of LE and the second type of LE reside at the same time within the PLD, wherein the first type of LE has a first number of inputs and uses less than the first number of inputs and the second type of LE has a second number of inputs and uses all of the second number of inputs, wherein:
   the first type of LE includes only one register, is configured to implement only one bit of arithmetic and cannot be configured as a 4:1 MUX; and
   the second type of LE includes two registers, is configured to implement two bits of arithmetic and is configured as a 4:1 MUX.

18. A programmable logic device ("PLD") including:
at least one logic array block ("LAB") of a first type having at least a first number of a first type of look up table ("LUT") based logic element ("LE") and a second number of a second type of LUT based LE; and
at least one LAB of a second type having at least a third number of the first type of LUT based LE and a fourth number of the second type of LUT based LE, wherein the first type of LAB is different from the second type of LAB and the first type of LUT based LE and the second type of LUT based LE have different numbers of inputs, wherein the first number does not equal the third number, wherein the second number does not equal the fourth number, wherein the first type of LAB and the second type of LAB reside at the same time within the PLD, wherein the fourth number is greater than zero, wherein the first type of LUT based LE is different from the second type of LUT based LE, wherein the first type of LUT based LE includes a first type of register and the second type of LUT based LE includes a second type of register, the first type of register including a register cascade input and a register cascade output and the second type of LUT based LE having neither a register cascade input or a register cascade output.

19. The PLD of claim 18, including at least a first column and a second column, wherein the first column includes only LABs of the first type and the second column includes only LABs of the second type.

20. The PLD of claim 18, including at least a first row and second row, wherein the first row includes only LABs of the first type and the at least second row includes only LABs of the second type.

21. The PLD of claim 18, including at least a first region and a second region, wherein the first region includes only LABs of the first type and the second region includes only LABs of the second type.

22. The PLD of claim 18, wherein the first type of LUT based LE includes a different number of registers than the second type of LUT based LE.

23. The PLD of claim 18, wherein the first type of LUT based LE includes at least a first type of LUT and the second type of LUT based LE includes at least a second type of LUT, wherein the first type of LUT, includes a different number of inputs than the second type of LUT.

24. The PLD of claim 18, wherein the first type of LUT based LE is fracturable and the second type of LUT based LE is not fracturable.

25. The PLD of claim 24, wherein the first type of LUT based LE includes a first type of LUT and the second type of LUT based LE includes a second type of LUT, the first type of LUT having a different number of fracturable inputs than the second type of LUT.

26. The PLD of claim 18, wherein the first type of LUT based LE includes a first type of dedicated arithmetic hardware and the second type of LUT based LE includes a second type of dedicated arithmetic hardware, the first type of dedicated arithmetic hardware being different from the second type of dedicated arithmetic hardware.

27. The PLD of claim 18, wherein the first type of LUT based LE includes dedicated arithmetic hardware and the second type of LUT based LE does not include dedicated arithmetic hardware.

28. The PLD of claim 18, wherein the first type of LUT based LE receives at least one different type of secondary signal than that received by the second type of LUT based LE.

29. The PLD of claim 18, wherein the first type of LUT based LE includes a different number of output drivers than the second type of LUT based LE.

30. The PLD of claim 18, wherein the first type of LUT based LE includes a first type of output driver and the second type of LUT based LE includes a second type of output driver, wherein the first type of output driver is different from the second type of output driver.

31. The PLD of claim 18, wherein the first type of LUT based LE is implemented using a different transistor level switching implementation than the second type of LUT based LE.

32. The PLD of claim 31, wherein the first type of LUT based LE uses relatively faster transistor level switches than the second type of LUT based LE.

33. The PLD of claim 31, wherein the first type of LUT based LE uses relatively more power efficient transistor level switches than the second type of LUT based LE.

34. The PLD of claim 18, wherein the first type of LUT based LE is relatively slower than the second type of LUT based LE.

35. The PLD of claim 18, wherein the first type of LAB has routed to it at least one secondary signal that is not routed to the second type of LAB.

36. The PLD of claim 18, wherein both the first type of LAB and the second type of LAB include a secondary signal generation unit and further wherein a greater number of secondary signals are routed to the secondary signal generation unit of the first type of LAB than are routed to the secondary signal generation unit of the second type of LAB.

37. The PLD of claim 18, wherein:
the first type of LAB includes a first secondary signal generation unit connectable through a first plurality of interconnections to LAB lines and local lines of the first type of LAB;
the second type of LAB includes a second secondary signal generation unit connectable through a second plurality of interconnections to LAB lines and local lines of the second type of LAB; and
wherein the number of interconnections available in the first plurality of interconnections is greater than the number of interconnections available in the second plurality of interconnections.

38. The PLD of claim 18, including a plurality of horizontal lines and vertical lines, wherein the first type of LAB is connected to a first number and type of horizontal lines and vertical lines and the second type of LAB is connected to a second number and type of horizontal lines and vertical lines.

39. The PLD of claim 18, wherein the first type of LAB has relatively greater routing flexibility than the second type of LAB.

40. A programmable logic device ("PLD") comprising:
at least one logic array block ("LAB") of a first type having at least a first number of a first type of look up table ("LUT") based logic element ("LE") and a second number of a second type of LUT based LE; and
at least one LAB of a second type having at least a third number of the first type of LUT based LE and a fourth number of the second type of LUT based LE, wherein the first type of LAB is different from the second type of LAB and the first type of LUT based LE and the second type of LUT based LE have different numbers of inputs, wherein the first number does not equal the third number, wherein the second number does not equal the fourth number, wherein the first type of LAB and the second type of LAB reside at the same time within the PLD, wherein the fourth number is greater than zero, wherein the first type of LUT based LE is different from the second type of LUT based LE, wherein the first type of LUT based LE includes a ternary adder circuit and the second type of LUT based LE does not include a ternary adder circuit.

41. A programmable logic device ("PLD") comprising:
at least one logic array block ("LAB") of a first type having at least a first number of a first type of look up table ("LUT") based logic element ("LE") and a second number of a second type of LUT based LE; and
at least one LAB of a second type having at least a third number of the first type of LUT based LE and a fourth number of the second type of LUT based LE, wherein the first type of LAB is different from the second type of LAB and the first type of LUT based LE and the second type of LUT based LE have different numbers of inputs, wherein the first number does not equal the third number, wherein the second number does not equal the fourth number, wherein the first type of LAB and the second type of LAB reside at the same time within the PLD, wherein the fourth number is greater than zero, wherein the first type of LUT based LE is different from the second type of LUT based LE, wherein:
the first type of LE includes only one register, is configured to implement only one bit of arithmetic and cannot be configured as a 4:1 MUX; and
the second type of LE includes two registers, is configured to implement two bits of arithmetic and is configured as a 4:1 MUX.

42. A programmable logic device (PLD) comprising:

at least one logic array block ("LAB") of a first type having at least a first number of a first type of look up table ("LUT") based logic element ("LE") and a second number of a second type of LUT based LE; and at least one LAB of a second type having at least a third number of the first type of LUT based LE and a fourth number of the second type of LUT based LE, wherein the first type of LAB is different from the second type of LAB and the first type of LUT based LE and the second type of LUT based LE have different numbers of inputs, wherein the first number does not equal the third number, wherein the second number does not equal the fourth number, wherein the first type of LAB and the second type of LAB reside at the same time within the PLD, wherein the fourth number is greater than zero, wherein the first type of LAB includes power down circuitry and the second type of LAB does not include power down circuitry.

43. A programmable logic device ("PLD") comprising:
at least one logic block, the one logic block including:
at least one lookup table ("LUT") based logic element ("LE") of a first type; and
at least one LUT based LE of a second type, wherein the first type of LE has a different hardware design from the second type of LE, wherein the first type of LE and the second type of LE reside at the same time within the PLD, wherein each of the first and second type of LE is configured to perform arithmetic and the first type of LE is configured to perform a lower number of bits of arithmetic than the second type of LE.

44. The PLD of claim 43, wherein the first type of LE includes at least a first type of LUT and the second type of LE includes at least a second type of LUT, wherein the first type of LUT includes a different number of inputs than the second type of LUT.

45. The PLD of claim 43, wherein the first type of LE is fracturable and the second type of LE is not fracturable.

* * * * *